United States Patent
Feler et al.

(10) Patent No.: US 11,686,576 B2
(45) Date of Patent: Jun. 27, 2023

(54) METROLOGY TARGET FOR ONE-DIMENSIONAL MEASUREMENT OF PERIODIC MISREGISTRATION

(71) Applicant: KLA Corporation, Milpitas, CA (US)

(72) Inventors: Yoel Feler, Haifa (IL); Mark Ghinovker, Yoqneam Ilit (IL)

(73) Assignee: KLA Corporation, Milpitas, CA (US)

( * ) Notice: Subject to any disclaimer, the term of this patent is extended or adjusted under 35 U.S.C. 154(b) by 2 days.

(21) Appl. No.: 17/098,835

(22) Filed: Nov. 16, 2020

(65) Prior Publication Data

US 2021/0381825 A1 Dec. 9, 2021

Related U.S. Application Data

(60) Provisional application No. 63/034,414, filed on Jun. 4, 2020.

(51) Int. Cl.
  *G01B 11/27* (2006.01)
  *G06T 7/00* (2017.01)

(52) U.S. Cl.
  CPC .......... *G01B 11/272* (2013.01); *G06T 7/0004* (2013.01); *G06T 2207/30148* (2013.01)

(58) Field of Classification Search
  CPC ............... G01B 11/272; G06T 7/0004; G06T 2207/30148
  See application file for complete search history.

(56) References Cited

U.S. PATENT DOCUMENTS

| | | | |
|---|---|---|---|
| 4,947,413 A | 8/1990 | Jewell et al. | |
| 5,216,257 A | 6/1993 | Brueck et al. | |
| 5,414,514 A | 5/1995 | Smith et al. | |
| 5,808,731 A | 9/1998 | Kirk | |
| 5,895,735 A | 4/1999 | Yoon | |
| 5,914,204 A | 6/1999 | Lee | |
| 6,958,819 B1 | 10/2005 | Heaton et al. | |

(Continued)

FOREIGN PATENT DOCUMENTS

| JP | 214765 Y1 | 8/1998 |
|---|---|---|
| JP | 2001093820 A | 4/2001 |

(Continued)

OTHER PUBLICATIONS

PCT International Search Report and Written Opinion for International Application No. PCT/US2021/034658 dated Sep. 14, 2021, 8 pages.

(Continued)

*Primary Examiner* — Jamil Ahmed
(74) *Attorney, Agent, or Firm* — Suiter Swantz pc llo

(57) ABSTRACT

A metrology target includes a first target structure set having one or more first target structures formed within at least one of a first working zone or a second working zone of a sample. The metrology target includes a second target structure set having one or more second target structures formed within at least one of the first working zone or the second working zone. The first working zone may include a center of symmetry that overlaps with a center of symmetry of the second working zone when an overlay error of one or more layers of the sample is not present. The metrology target may additionally include a third target structure set, a fourth target structure set, or a fifth target structure set.

46 Claims, 12 Drawing Sheets

(56) References Cited

U.S. PATENT DOCUMENTS

| | | |
|---|---|---|
| 7,068,833 B1 | 6/2006 | Ghinovker et al. |
| 7,247,843 B1 | 7/2007 | Moon |
| 7,440,105 B2 | 10/2008 | Adel et al. |
| 7,541,201 B2 | 6/2009 | Ghinovker |
| 7,602,491 B2 | 10/2009 | Kandel et al. |
| 7,879,627 B2 | 2/2011 | Ghinovker et al. |
| 8,330,281 B2 | 12/2012 | Ghinovker et al. |
| 9,123,649 B1 | 9/2015 | Manassen et al. |
| 9,214,317 B2 | 12/2015 | Shur |
| 9,476,698 B2 | 10/2016 | Abdulhalim et al. |
| 9,864,209 B2 | 1/2018 | Levinski et al. |
| 10,190,979 B2 | 1/2019 | Manassen et al. |
| 10,197,389 B2 | 2/2019 | Levinski et al. |
| 10,488,768 B2 | 11/2019 | Auer et al. |
| 10,527,951 B2 | 1/2020 | Yohanan et al. |
| 10,585,357 B2 | 3/2020 | Schaar et al. |
| 10,726,169 B2 | 7/2020 | Adel et al. |
| 10,824,079 B2 | 11/2020 | Lubashevsky et al. |
| 11,073,768 B2 | 7/2021 | Hill et al. |
| 11,164,307 B1 | 11/2021 | Feler et al. |
| 2001/0021477 A1 | 9/2001 | Dirksen et al. |
| 2002/0080364 A1 | 6/2002 | Monshouwer et al. |
| 2004/0169861 A1 | 9/2004 | Mieher et al. |
| 2005/0195398 A1 | 9/2005 | Adel et al. |
| 2006/0238761 A1 | 10/2006 | Lin et al. |
| 2007/0076205 A1 | 4/2007 | Schulz |
| 2007/0077503 A1 | 4/2007 | Yoo |
| 2007/0234786 A1 | 10/2007 | Moon |
| 2007/0242272 A1 | 10/2007 | Suehira et al. |
| 2007/0279630 A1 | 12/2007 | Kandel et al. |
| 2008/0023855 A1* | 1/2008 | Ghinovker ............... G06T 7/33 257/E23.179 |
| 2009/0042108 A1 | 2/2009 | Yasuzato |
| 2010/0267682 A1 | 10/2010 | Johri et al. |
| 2011/0058170 A1 | 3/2011 | Ausschnitt et al. |
| 2011/0122496 A1 | 5/2011 | Schaar et al. |
| 2012/0253325 A1 | 10/2012 | Sniffin et al. |
| 2013/0035888 A1 | 2/2013 | Kandel et al. |
| 2013/0193602 A1 | 8/2013 | Suzuki et al. |
| 2013/0252429 A1 | 9/2013 | Okamoto et al. |
| 2014/0065736 A1 | 3/2014 | Amir et al. |
| 2014/0199791 A1 | 7/2014 | Park et al. |
| 2014/0240704 A1 | 8/2014 | Komine et al. |
| 2014/0351771 A1 | 11/2014 | Amir |
| 2015/0235880 A1 | 8/2015 | Inada et al. |
| 2016/0300767 A1 | 10/2016 | Ko et al. |
| 2017/0146338 A1 | 5/2017 | Allen |
| 2017/0307367 A1 | 10/2017 | Yaegashi et al. |
| 2018/0024054 A1 | 1/2018 | Moon et al. |
| 2018/0246420 A1 | 8/2018 | Pandey et al. |
| 2018/0275530 A1* | 9/2018 | Kandel ............... G03F 7/70633 |
| 2019/0033726 A1 | 1/2019 | Adam et al. |
| 2019/0049373 A1 | 2/2019 | Levinski |
| 2019/0250504 A1 | 8/2019 | Feler et al. |
| 2019/0285996 A1 | 9/2019 | Shibayama et al. |
| 2021/0072650 A1 | 3/2021 | Feler et al. |
| 2021/0364279 A1 | 11/2021 | Manassen et al. |
| 2021/0364935 A1 | 11/2021 | Gdor et al. |
| 2022/0034652 A1 | 2/2022 | Manassen et al. |

FOREIGN PATENT DOCUMENTS

| | | |
|---|---|---|
| JP | 2002134394 A | 5/2002 |
| JP | 2007140460 | 2/2009 |
| JP | 2010267682 A | 11/2010 |
| JP | 2011243664 A | 12/2011 |
| JP | 2012253325 A | 12/2012 |
| JP | 2013074258 A | 4/2013 |
| JP | 2013254780 | 7/2015 |
| JP | 2015154008 A | 8/2015 |
| WO | 2018004511 A1 | 1/2018 |

OTHER PUBLICATIONS

U.S. Appl. No. 17/119,536, filed Dec. 11, 2020, Paskover et al.
U.S. Appl. No. 17/140,999, filed Jan. 4, 2021, Hill et al.
U.S. Appl. No. 17/142,783, filed Jan. 6, 2021, Hill et al.
U.S. Appl. No. 17/708,958, filed Mar. 30, 2022, Manassen et al.
U.S. Appl. No. 17/709,104, filed Mar. 30, 2022, Lubashevksy et al.
Adel, Mike et al., "Diffraction order control in overlay metrology: a review of the roadmap options," Proc. SPIE. 6922, Metrology, Inspection, and Process Control for Microlithography XXII, 692202 (2008).
Buttgereit, et al., "Phame(R)—high resolution off-axis phase shift measurements on 45nm node features," 24th European Mask and Lithography Conference, 2008, pp. 1-7, doi: 10.1117/12.798805.
Di, et al., "Moiré-Based Absolute Interferometry With Large Measurement Range in Wafer-Mask Alignment", IEEE Photonics Technology Letters, vol. 27, No. 4, pp. 435-438, 2015. doi:10.1109/LPT.2014.2377037.
Fesperman Jr., Ronnie Rex, (2006). Multiscale Alignment and Positioning System. (UMI 3264369) [Doctor of Philosophy, University of North Carolina] ProQuest Information and Learning Company.
Kikuchi et al., "Principle and observation of fluorescence moiré fringes for alignment in print and imprint methods" J. Vac. Sci. Technol. B 35, 06G303 (2017); https://doi.org/10.1116/1.4990844, Submitted: Jun. 19, 2017 . Accepted: Aug. 31, 2017 . Published Online: Sep. 26, 2017.
Moon, et al., "Immunity to Signal Degradation by Overlayers Using a Novel Spatial-Phase-Matching Alignment System", J. Vac. Sci. Technol. B 13, 2648-2652 (1995).
Servin, et al., "Mask contribution on CD & OVL errors budgets for Double Patterning Lithography," 25th European Mask and Lithography Conference, 2009, pp. 1-13.
Wu, et al., (2012). Nanoimprint lithography with ≤60 nm overlay precision. Applied Physics A, 106, 767-772.
Zhou, et al., (2015). Moiré-Based Interferometry for Magnification Calibration of Bitelecentric Lens System. IEEE Photonics Journal. 7. 1-11. 10.1109/JPHOT.2015.2500892.
Zhou, et al., "Fourier-based analysis of moiré fringe patterns of superposed gratings in alignment of nanolithography", Optics Express, vol. 16, No. 11, p. 7869, 2008. doi:10.1364/OE.16.007869.
Zhu et al. Four-quadrant gratings moiré fringe alignment measurement in proximity lithography. Optics Express. Feb. 2013;21(3):3463-3473. DOI: 10.1364/oe.21.003463. PMID: 23481804.
Zhu, et al., (2015). Adjustment Strategy for Inclination Moiré Fringes in Lithography by Spatial Frequency Decomposition. IEEE Photonics Technology Letters. 27. 395-398. 10.1109/LPT.2014.2370072.

* cited by examiner

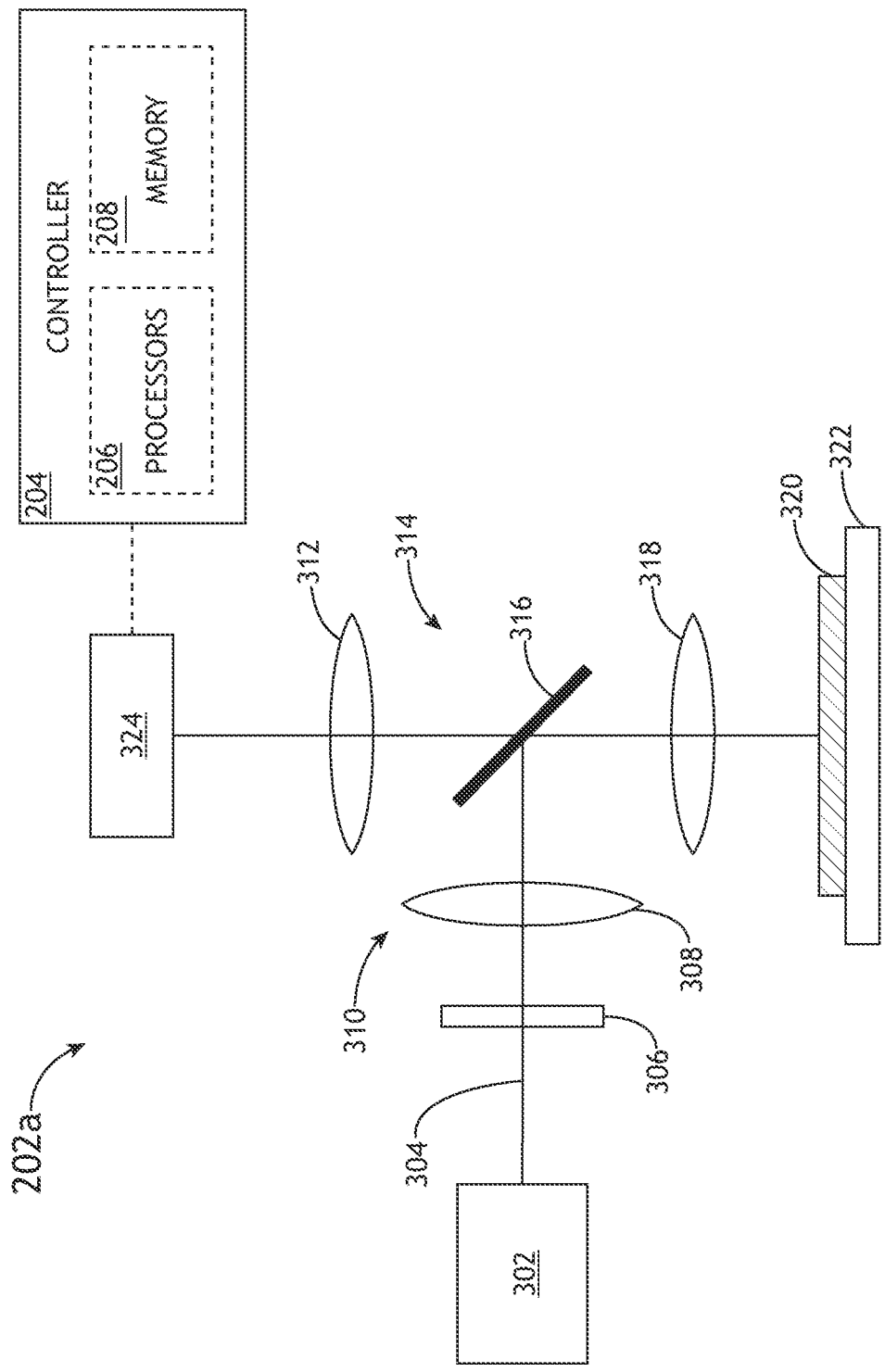

METROLOGY TARGET FOR ONE-DIMENSIONAL MEASUREMENT OF PERIODIC MISREGISTRATION

CROSS-REFERENCE TO RELATED APPLICATION

The present application claims the benefit under 35 U.S.C. § 119(e) of U.S. Provisional Application Ser. No. 63/034,414, filed Jun. 4, 2020, entitled ADVANCED DESIGN OF ONE-DIMENSIONAL PERIODIC MISREGISTRATION MEASUREMENT MARKS, naming Yoel Feler and Mark Ghinovker as inventors, which is incorporated herein by reference in the entirety.

TECHNICAL FIELD

The present disclosure is related generally to overlay metrology and, more particularly, to overlay metrology using metrology targets for one-dimensional measurement of periodic misregistration.

BACKGROUND

Overlay metrology targets are typically designed to provide diagnostic information regarding the alignment of multiple layers of a sample by characterizing an overlay target having target features located on sample layers of interest. Further, the overlay alignment of the multiple layers is typically determined by aggregating overlay measurements of multiple overlay targets at various locations across the sample. However, the accuracy of an overlay measurement of an overlay metrology target may be sensitive to the particular location on a sample. In this regard, as the size of overlay metrology samples continues to decrease, it becomes necessary to use overlay metrology targets configured to fit on and/or within overlay metrology samples. Current methods of overlay metrology frequently involve metrology along two measurement directions (e.g., two-dimensional metrology). However, two-dimensional metrology often requires metrology targets of a larger size.

Accordingly, it may be desirable to provide a metrology target compatible with one-dimensional metrology methods, where the metrology target may occupy a smaller area of an overlay metrology sample.

SUMMARY

A metrology target is disclosed, in accordance with one or more embodiments of the present disclosure. In one embodiment, the metrology target includes a first target structure set formed on one or more layers of a sample, wherein the first target structure set comprises at least one first target structure formed within at least one of a first working zone of the metrology target or a second working zone of the metrology target, wherein each first target structure comprises one or more first pattern elements formed along at least one of a first measurement direction or a second measurement direction; and a second target structure set formed on one or more layers of the sample, wherein the second target structure set comprises at least one second target structure formed within at least one of the first working zone of the metrology target or the second working zone of the metrology target, wherein each second target structure comprises one or more second pattern elements formed along at least one of the first measurement direction or the second measurement direction, and wherein a center of symmetry of the first working zone of the metrology target and a center of symmetry of the second working zone of the metrology target overlap when an overlay error between one or more layers of the sample is not present, and wherein a difference with respect to the overlap of the center of symmetry of the first working zone and the center of symmetry of the second working zone is indicative of one or more overlay errors between layers of the metrology target along at least one of the first measurement direction or the second measurement direction.

A system is disclosed, in accordance with one or more embodiments of the present disclosure. In one embodiment, the system includes a controller communicatively couplable to one or more metrology sub-systems, wherein the controller includes one or more processors, wherein the one or more processors are configured to execute a set of program instructions maintained in memory, wherein the set of program instructions is configured to cause the one or more processors to: receive, from the one or more metrology sub-systems, one or more signals indicative of illumination emanating from a metrology target of a sample, wherein the metrology target of the sample comprises: a first target structure set formed on one or more layers of the sample, wherein the first target structure set comprises at least one first target structure formed within at least one of a first working zone of the metrology target or a second working zone of the metrology target, wherein each first target structure comprises one or more first pattern elements formed along at least one of a first measurement direction or a second measurement direction; and a second target structure set formed on one or more layers of the sample, wherein the second target structure set comprises at least one second target structure formed within at least one of the first working zone of the metrology target or the second working zone of the metrology target, wherein each second target structure comprises one or more second pattern elements formed along at least one of the first measurement direction or the second measurement direction, and wherein a center of symmetry of the first working zone of the metrology target and a center of symmetry of the second working zone of the metrology target overlap when an overlay error between one or more layers of the sample is not present, and wherein a difference with respect to the overlap of the center of symmetry of the first working zone and the center of symmetry of the second working zone is indicative of one or more overlay errors between layers of the metrology target along at least one of the first measurement direction or the second measurement direction; generate at least a first overlay measurement based on one or more signals indicative of illumination emanating from one or more portions of the first target structure set; generate at least a second overlay measurement based on one or more signals indicative of illumination emanating from one or more portions of the second target structure set; and determine an overlay error of the sample based on the first overlay measurement and the second overlay measurement.

A method of measuring overlay of a sample is disclosed, in accordance with one or more embodiments of the present disclosure. The method of measuring overlay of a sample may include illuminating a sample having a metrology target, the metrology target comprising: a first target structure set formed on one or more layers of the sample, wherein the first target structure set comprises at least one first target structure formed within at least one of a first working zone of the metrology target or a second working zone of the metrology target, wherein each first target structure comprises one or more first pattern elements formed along at least one of a first measurement direction or a second measurement direction, and a second target structure set formed on one or more layers of the sample, wherein the second target structure set comprises at least one second target structure formed within at least one of the first working zone of the metrology target or the second working zone of the metrology target, wherein each second target structure comprises one or more second pattern elements formed along at least one of the first measurement direction or the second measurement direction, and wherein a center of symmetry of the first working zone of the metrology target and a center of symmetry of the second working zone of the metrology target overlap when an overlay error between one or more layers of the sample is not present, and wherein a difference with respect to the overlap of the center of symmetry of the first working zone and the center of symmetry of the second working zone is indicative of one or more overlay errors between layers of the metrology target along at least one of the first measurement direction or the second measurement direction; detecting illumination emanating from the metrology target of the sample; generating at least a first overlay measurement based on one or more signals indicative of illumination emanating from one or more portions of the first target structure set; generating at least a second overlay measurement based on one or more signals indicative of illumination emanating from one or more portions of the second target structure set; and determining an overlay error of the sample based on the first overlay measurement and the second overlay measurement.

A method of forming a metrology target is disclosed, in accordance with one or more embodiments of the present disclosure. The method of forming a metrology target may include forming a first target structure set on one or more layers of a sample, wherein the first target structure set comprises at least one first target structure formed within at least one of a first working zone of the metrology target or a second working zone of the metrology target, wherein each first target structure comprises one or more first pattern elements formed along at least one of a first measurement direction or a second measurement direction; and forming a second target structure set on one or more layers of the sample, wherein the second target structure set comprises at least one second target structure formed within at least one of the first working zone of the metrology target or the second working zone of the metrology target, wherein each second target structure comprises one or more second pattern elements formed along at least one of the first measurement direction or the second measurement direction, and wherein a center of symmetry of the first working zone of the metrology target and a center of symmetry of the second working zone of the metrology target overlap when an overlay error between one or more layers of the sample is not present, and wherein a difference with respect to the overlap of the center of symmetry of the first working zone and the center of symmetry of the second working zone is indicative of one or more overlay errors between layers of the metrology target along at least one of the first measurement direction or the second measurement direction.

BRIEF DESCRIPTION OF DRAWINGS

The numerous advantages of the disclosure may be better understood by those skilled in the art by reference to the accompanying figures.

FIG. 3A illustrates a conceptual view of a metrology sub-system, in accordance with one or more embodiments of the present disclosure.

DETAILED DESCRIPTION

Figure 1A:
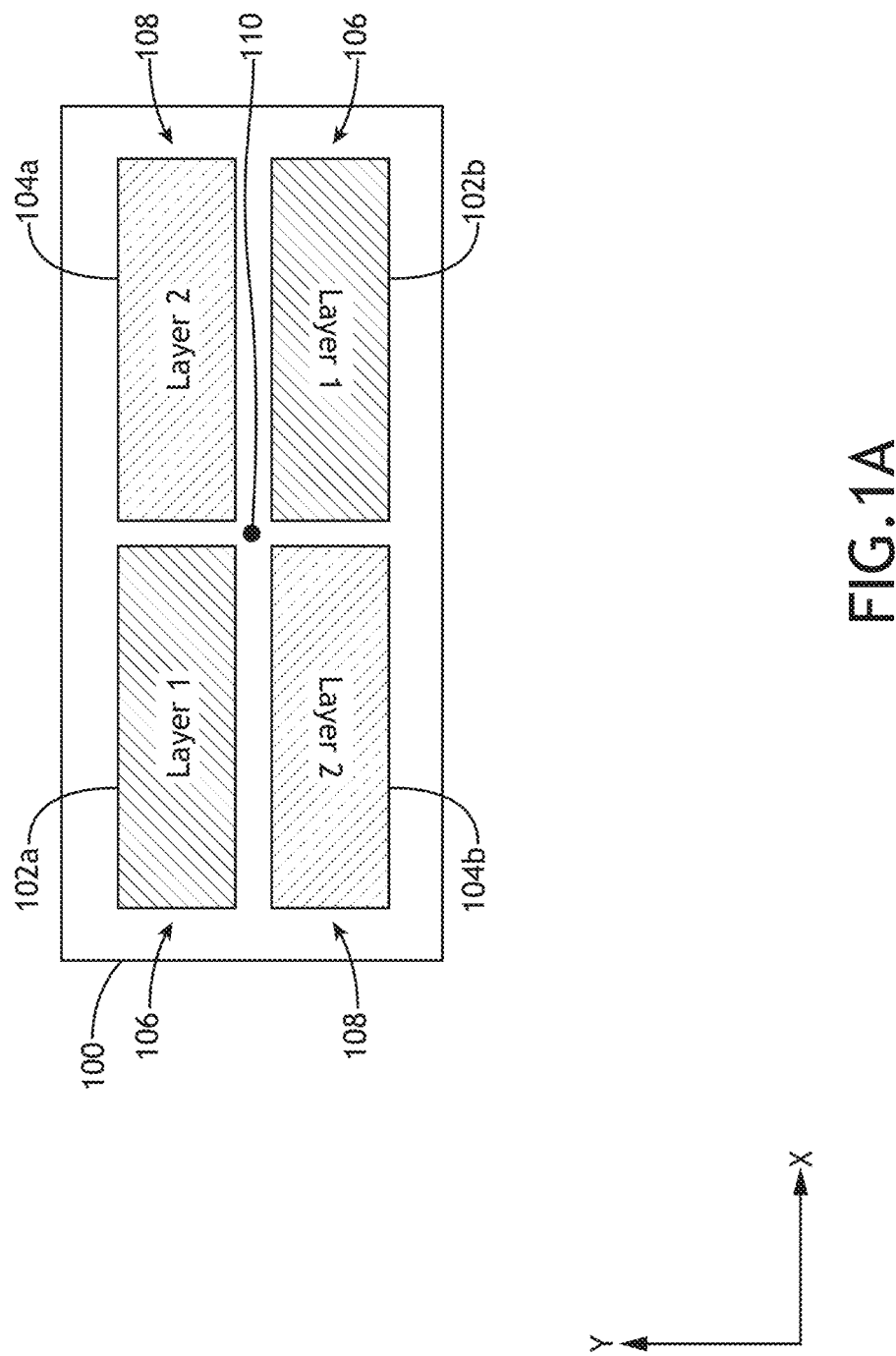
FIG. 1A is a top view of a metrology target, in accordance with one or more embodiments of the present disclosure.

A semiconductor device may be formed as multiple printed layers of patterned material on a substrate. Each printed layer may be fabricated through a series of process steps such as, but not limited to, one or more material deposition steps, one or more lithography steps, or one or more etching steps. In some fabrication processes, the printed layers may be formed using one or more photo resist materials. For example, a photo resist material may be deposited onto the substrate. The photo resist material may then be exposed to illumination, wherein the illumination produces a latent target pattern on the photo resist material. The latent target pattern (or a developed target pattern formed from the latent target pattern) may then be used as a pattern for one or more lithography and/or one or more etching steps configured to form a final target pattern on the substrate for use in overlay and/or metrology applications. In other fabrication processes, the photo resist material is exposed to illumination to produce a latent target pattern on the photo resist material, and the latent target pattern (or a developed target pattern formed from the latent target pattern) is used in overlay and/or metrology applications.

During fabrication, each printed layer must typically be fabricated within selected tolerances to properly construct the final device. For example, the relative placement of printed elements in each layer (e.g., the overlay or the overlay parameters) must be well characterized and controlled with respect to previously fabricated layers. Accordingly, metrology targets may be fabricated on one or more printed layers to enable efficient characterization of the overlay of the layers. Deviations of overlay target features on a printed layer may thus be representative of deviations of printed characteristics of printed device features on that layer. Further, overlay measured at one fabrication step (e.g., after the fabrication of one or more sample layers) may be used to generate correctables for precisely aligning a process tool (e.g., a lithography tool, or the like) for the fabrication of an additional sample layer in a subsequent fabrication step.

Metrology targets may typically include well-defined printed elements designed to provide an accurate representation of one or more printing characteristics. In this regard, measured characteristics of printed elements of a metrology target (e.g., by a metrology tool) may be representative of printed device elements associated with a device being fabricated. Further, metrology targets are typically characterized as having one or more measurement cells, where each cell includes printed elements in one or more layers on the sample. A metrology measurement may then be based on any combination of measurements of the size, orientation, or location (e.g., pattern placement) of printed elements in a single cell or between multiple cells. For example, one or more cells of an overlay metrology target may include printed elements on two or more sample layers arranged such that the relative positions of elements of each layer may be indicative of offset errors (e.g., pattern placement errors (PPE)) in a particular layer or overlay errors associated with registration errors between sample layers. By way of another example, process-sensitive metrology targets may include printed elements on a single sample layer, where one or more characteristics of the printed elements (e.g., width or critical dimension (CD), sidewall angle, position, or the like) are indicative of one or more process metrics including, without limitation, the dose of illumination during a lithography step or a focal position of the sample in a lithography tool during a lithography step.

Overlay metrology is typically performed by fabricating one or more overlay targets across a sample, where each overlay target includes features in sample layers of interest, which are fabricated at the same time as features associated with a device or component being fabricated. In this regard, overlay errors measured at a location of an overlay target may be representative of overlay errors of device features. Accordingly, overlay measurements may be used to monitor and/or control any number of fabrication tools to maintain production of devices according to specified tolerances. For example, overlay measurements of a current layer with respect to a previous layer on one sample may be utilized as feed-back data to monitor and/or mitigate deviations of the fabrication of the current layer on additional samples within a lot. By way of another example, overlay measurements of a current layer with respect to a previous layer on one sample may be utilized as feed-forward data to fabricate a subsequent layer on the same sample in a way that takes into account the existing layer alignments.

Overlay targets typically include features specifically designed to be sensitive to overlay errors between sample layers of interest. An overlay measurement may then be carried out by characterizing the overlay target using an overlay metrology tool and applying an algorithm to determine overlay errors on the sample based on the output of the metrology tool.

Regardless of the overlay measurement technique, an overlay metrology tool is typically configurable according to a recipe including a set of measurement parameters utilized to generate an overlay signal. For example, a recipe of an overlay metrology tool may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, or the like. Accordingly, an overlay recipe may include a set of measurement parameters for generating an overlay signal suitable for determining overlay of two or more sample layers.

Overlay metrology tools may utilize a variety of techniques to determine the overlay of sample layers. For example, image-based overlay metrology tools may illuminate an overlay target (e.g., an advanced imaging metrology (AIM) target, a box-in-box metrology target, or the like) and capture an overlay signal including an image of overlay target features located on different sample layers. Accordingly, overlay may be determined by measuring the relative positions of the overlay target features. By way of another example, scatterometry-based overlay metrology tools may illuminate an overlay target (e.g., a grating-over-grating metrology target, or the like) and capture an overlay signal including an angular distribution of radiation emanating from the overlay target associated with diffraction, scattering, and/or reflection of the illumination beam. Accordingly, overlay may be determined based on models of the interaction of an illumination beam with the overlay target.

It is recognized herein that various overlay metrology tools may be used to measure overlay. For example, optical metrology tools (e.g., light-based metrology tools using electromagnetic radiation for illumination and/or detection) may provide high-throughput overlay measurements using numerous techniques such as, but not limited to, determining relative positions of spatially-separated features on multiple layers in an image, directly measuring PPE on multiple layers, or scatterometry in which overlay is determined based on light scattered and/or diffracted from diffraction gratings on multiple layers. For the purposes of the present disclosure, the term "optical metrology tools," "optical metrology techniques," and the like indicate metrology tools and techniques using electromagnetic radiation of any wavelength such as, but not limited to, x-ray wavelengths, extreme ultraviolet (EUV) wavelengths, vacuum ultraviolet (VUV) wavelengths, deep ultraviolet (DUV) wavelengths, ultraviolet (UV) wavelengths, visible wavelengths, or infrared (IR) wavelengths. Systems, methods, and apparatuses related to overlay measurement are generally described in U.S. Pat. No. 8,330,281 titled "OVERLAY MARKS, METHODS OF OVERLAY MARK DESIGN AND METHODS OF OVERLAY MEASUREMENTS" and issued on Dec. 11, 2012, U.S. Pat. No. 9,476,698 titled "PERIODIC PATTERNS AND TECHNIQUE TO CONTROL MISALIGNMENT BETWEEN TWO LAYERS" and issued on Oct. 25, 2016, U.S. Pat. No. 7,541,201 titled "APPARATUS AND METHODS FOR DETERMINING OVERLAY OF STRUCTURES HAVING ROTATIONAL OR MIRROR SYMMETRY" and issued on Jun. 2, 2009, U.S. Patent Publication No. 2013/0035888 titled "METHOD AND SYSTEM FOR PROVIDING A QUALITY METRIC FOR IMPROVED PROCESS CONTROL" and published on Feb. 7, 2013, U.S. Pat. No. 9,214,317 titled "SYSTEM AND METHOD OF SEM OVERLAY METROLOGY" issued on Dec. 15, 2015, U.S. Pat. No. 10,527,951 B2 titled "COMPOUND IMAGING METROLOGY TARGETS" issued on Jan. 7, 2020, U.S. Pat. No. 10,190,979 B2 titled "METROLOGY IMAGING TARGETS HAVING REFLECTION-SYMMETRIC PAIRS OF REFLECTION-ASYMMETRIC STRUCTURES" issued on Jan. 29, 2019, and PCT Application No. PCT/US2016/039531 titled "APPARATUS AND METHOD FOR THE MEASUREMENT OF PATTERN PLACEMENT AND SIZE OF PATTERN AND COMPUTER PROGRAM THEREFOR" and filed on Jun. 27, 2016, all of which are incorporated herein by reference in their entirety.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist (including a photoresist), a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

FIG. 1A is a top view of a metrology target 100, in accordance with one or more embodiments of the present disclosure. The metrology target 100 may include a first target structure set formed on one or more layers of the metrology target 100. The first target structure set may include a first set of working zones 106. The first set of working zones include a first working zone 102a and at least a second working zone 102b. The one or more first target structures may be formed within the first working zone 102a of the metrology target 100 and the second working zone 102b of the metrology target 100. The first working zone 102a and the second working zone 102b may be located within a single layer of the metrology target 100. The one or more first target structures within the working zones 102a and 102b may include one or more first pattern elements configured for measurement along at least one of a first measurement direction (e.g., an x-direction), or a second measurement direction (e.g., a y-direction). The orientation of one or more patterns in the first working zone 102a of the first set of working zones 106 is different from the orientation of one or more patterns in the at the second working zone 102b of the first set of working zones 106. For example, the pattern within the first working zone 102a may be a rotation of the pattern in the second working zone 102b.

The metrology target 100 may include a second target structure set formed on a layer of the metrology target 100. The second target structure set may include a second set of working zones 108. The second set of working zones 108 include a first working zone 104a and at least a second working zone 104b. The one or more second set target structures may be formed within at least one of the first working zone 104a of the or the second working zone 104b of the second set of working zones 108. Each of the first working zone 104a and the second working zone 104b of the second working zone 108 may be located within a layer of the metrology target 100. This layer may be the same or different from the layer for the first working zone 102a and the second working zone 102b of the first set of working zones. The one or more second target structures may include one or more second pattern elements configured for measurement along at least one of the first measurement direction (e.g., an x-direction), or the second measurement direction (e.g., a y-direction). The orientation of one or more patterns in the first working zone 104a of the second set of working zones 108 is different from the orientation of one or more patterns in the at the second working zone 104b of the second set of working zones 108. For example, the pattern within the first working zone 104a may be a rotation of the pattern in the second working zone 104b and configured such that the first working zone and the second working zone are two-fold rotationally symmetric and the target 100 as a whole is two-fold rotationally symmetric. It is noted that each rectangle 102a, 102b, 104a, 104b within FIG. 1A (and any other figures) represents a one-dimensional or two-dimensional periodic structure. The pattern elements of the working zones 102a, 102b, 104a, and 104b may be compatible with any metrology mode known in the art to be suitable for the purposes contemplated by the present disclosure. For example, the one or more second pattern elements may be compatible with a scatterometry-based overlay (SCOL) metrology mode. In this regard, the one or more second pattern elements may be configured to include periodic and/or segmented structures for metrology using SCOL-based metrology methods (e.g., grating-over-grating structures, or any structure known in the art to be suitable for diffracting, scattering, and/or reflecting an illumination beam). By way of another example, the one or more second pattern elements may be compatible with any image-based overlay metrology mode, including, without limitation, an advanced imaging metrology mode (e.g., AIM, triple advanced imaging metrology (TAIM), robust advanced imaging metrology (rAIM), advanced imaging metrology in-die (AIMid), box-in-box metrology, or any other metrology mode known in the art to be suitable for capturing an overlay signal (e.g., an image of overlay target features located on different sample layers). It is noted that the one or more second pattern elements may include any one-dimensional or two-dimensional structure, such as any one-dimensional or two-dimensional periodic structure, formed by any means known in the art, including, without limitation, one or more lithographic steps, one or more direct etching steps, or the like.

The first set of working zones 106 and the second set of working zones 108 may be formed in such a manner that the first set of working zones 106 and the second set of working zones 108 may facilitate one or more overlay measurements based on the exploitation of rotational symmetry of one or more elements of the first set of working zones 106 and the second set of working zones 108. For example, the first set of working zones 106 may be formed such that elements of the first set of working zones 106 (e.g., the one or more working zones 102a, 102b of the first set of working zones 106) have a center of rotation symmetry, and the second set of working zones 108 may be formed such that elements of the second set of working zones 108 (e.g., the one or more working zones 104a, 104b of the second set of working zones 108) have a center of rotation symmetry, where each of the foregoing centers of symmetry overlap at a center of rotation symmetry 110 of the metrology target 100. In this way, any difference with respect to the overlap of the respective centers of rotation symmetry may be attributed to or may be indicative of overlay error between layers of the metrology target 100. It is contemplated that the first set of working zones 106 and the second set of working zones 108 may be two-fold rotationally symmetric, but embodiments of the present disclosure are not limited to the first set of working zones 106 and the second set of working zones 108 having two-fold rotational symmetry. For example, the first set of working zones 106 and the second set of working zones 108 may be four-fold rotationally symmetric. It is noted that the rotational symmetry of the first set of working zones 106 and the second set of working zones 108 may mitigate certain issues arising in connection with one or more metrology sub-systems, including, without limitation, wafer angular misplacement error, which may arise during measurement.

Figure 1B:
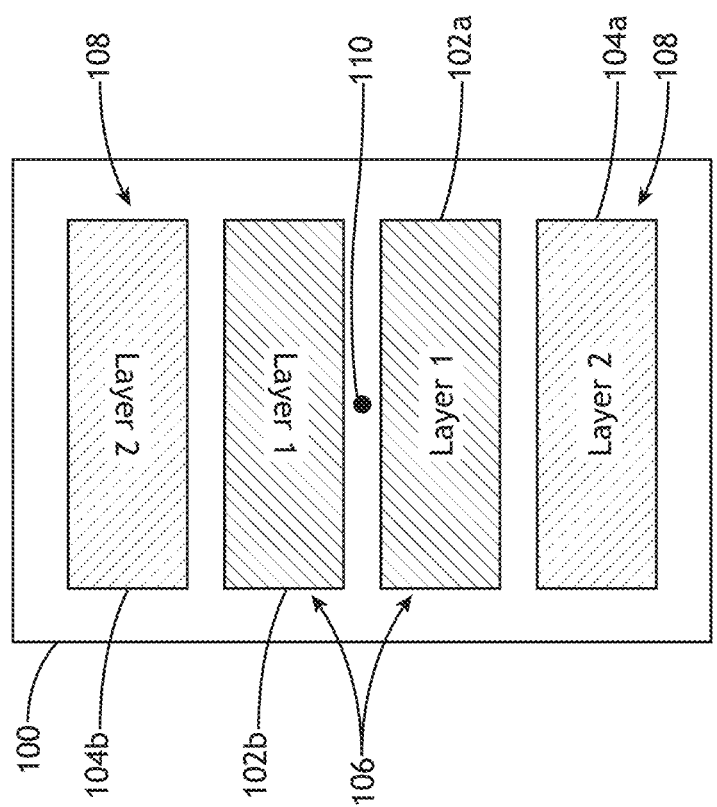
FIG. 1B is a top view of a metrology target, in accordance with one or more embodiments of the present disclosure.

In some embodiments, the individual working zones (e.g., 102a/102b or 104a/104b) within a given set of working zones 106, 108 may be placed diagonally to each other. For example, in the case of the first set of working zones 106, the first working zone 102a is diagonal to the second working zone 102b. By way of another example, in the case of the second set of working zones 108, the first working zone 104a is diagonal to the second working zone 104b. In other embodiments, as shown in FIG. 1B, the second working zone 102b of the first set of working zones 106 may be formed vertically adjacent to the first working zone 102a of the first set of working zones 106 and the first working zone 102a and the second working zone 102b of the first working zone set 106 are formed between the first working zone 104a and the second working zone 104b of the second working zone set 108. It is noted that the relative positions of the first working zone set 106 and the second working zone set 108 may be chosen in order to comply with design size or metrology operation requirements. For example, the metrology target 100 may be configured to occupy less space on a metrology sample based on the relative placement of the first working zone set 106 and the second working zone set 108. It is noted that the first working zone set 106 and the second working zone set 108 may be formed in different physical layers. Alternatively, the first working zone set 106 and the second working zone set 108 may formed in the same physical layer and have different features (e.g., different fine segmentations, different coarse pitches, etc.).

Figure 1C:
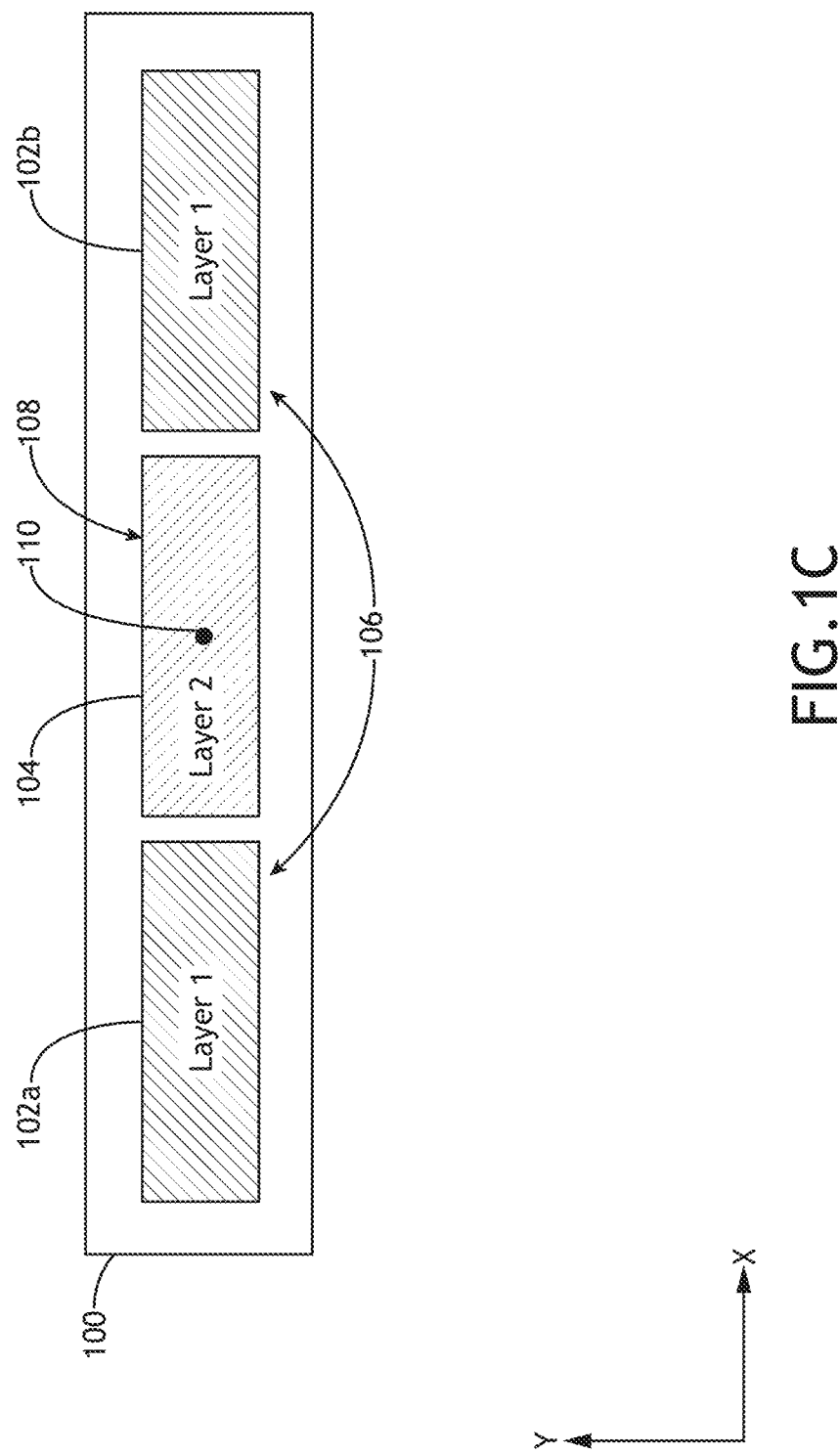
FIG. 1C is a top view of a metrology target, in accordance with one or more embodiments of the present disclosure.
Figure 1D:
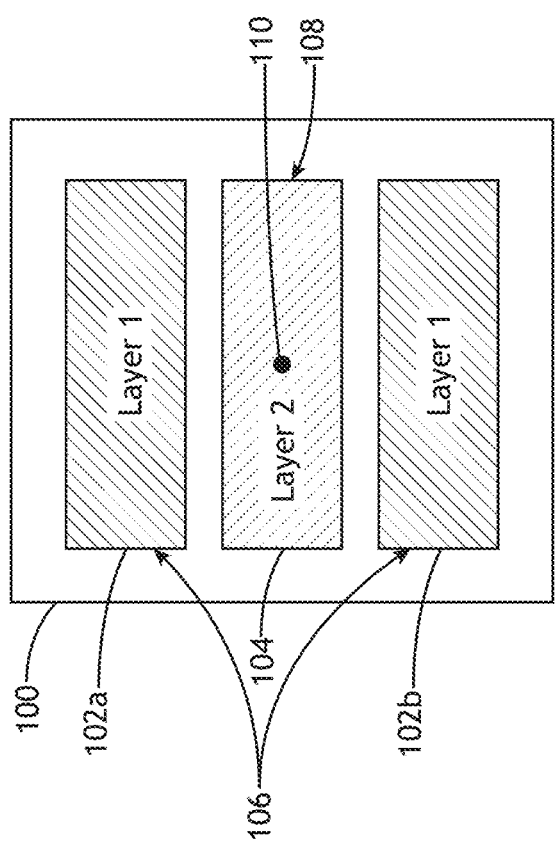
FIG. 1D is a top view of a metrology target, in accordance with one or more embodiments of the present disclosure.
Figure 1D:
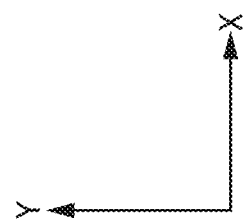

In another embodiment, FIGS. 1C and 1D, the first working zone set 106 includes two working zones 102a, 102b and the second working zone set 108 includes one working zone 104.

It is further noted that an exterior form-factor of the first working zone 102a and the at least the second working zone 102b of the first working zone set 106 and the first working zone 104a and the at least the second working zone 104b of the second working zone set 108 comprise at least one of a square, a rectangle, a circle, a star, or a rhombus. In addition, the sizes of the first working zone 102a and the at least the second working zone 102b of the first working zone set 106 may be, but need not be, different from the sizes of the first working zone 104a and the at least the second working zone 104b of the second working zone set 108.

Figure 1E:
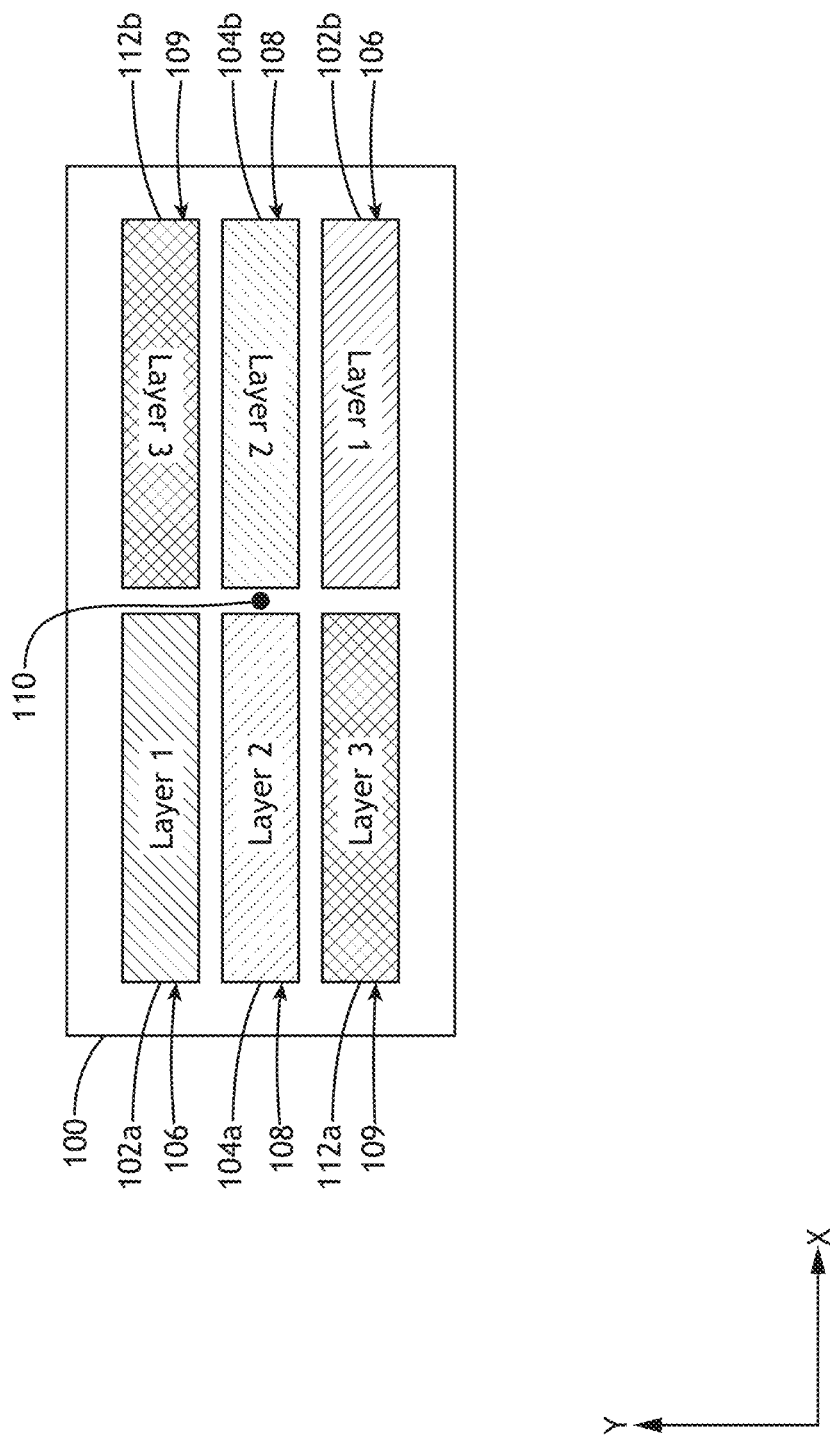
FIG. 1E is a top view of a metrology target, in accordance with one or more embodiments of the present disclosure.

The description related to FIG. 1A should be interpreted to extend to any target of any number of working zone sets formed on any number of layers as discussed throughout the present disclosure. In another embodiment, as shown in FIG. 1E, the metrology target 100 may include a third set of workings zones 109. The third set of working zones 109 may include a first working zone 112a and a second working zone 112b. A third target structure set may include one or more third target structures formed within the first working zone 112a and the second working zone 112b.

Figure 1F:
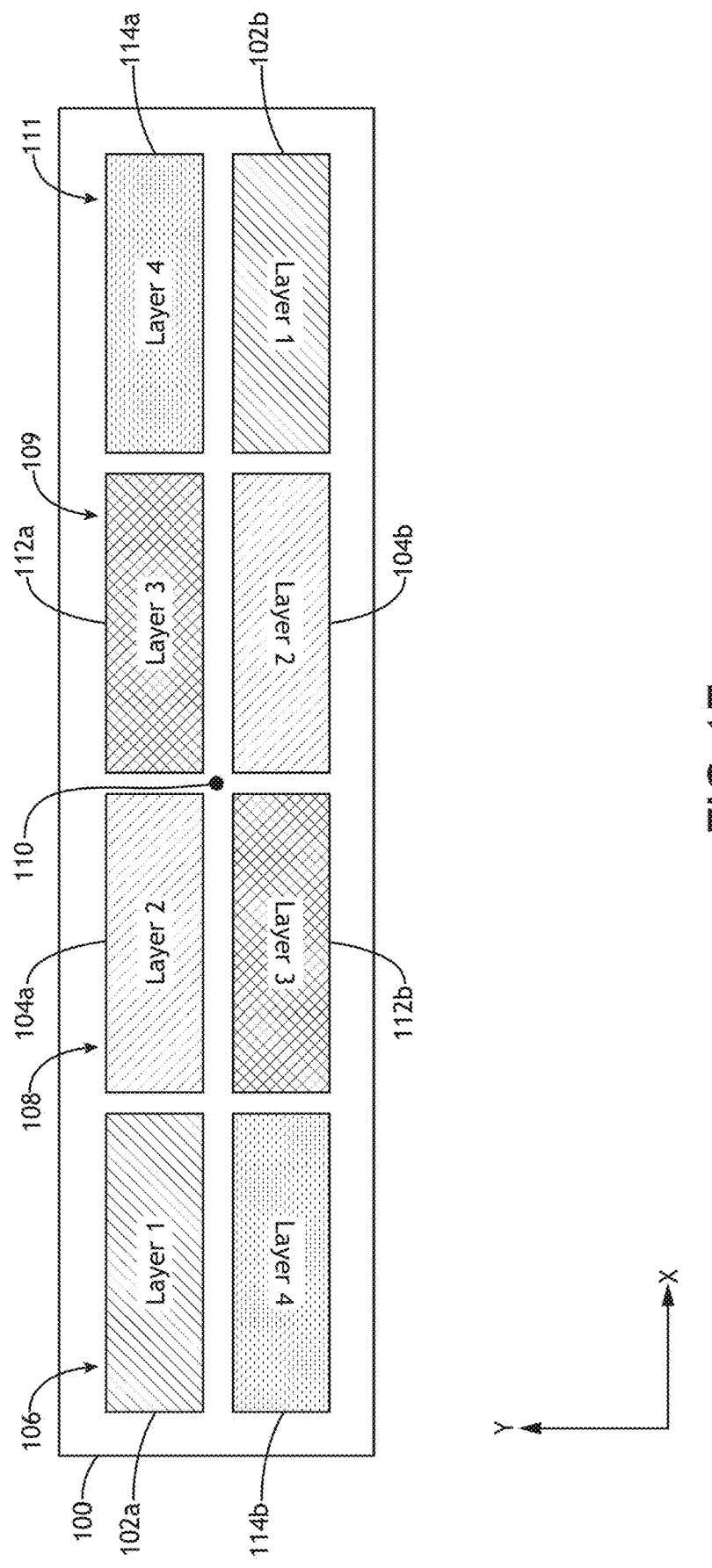
FIG. 1F is a top view of a metrology target, in accordance with one or more embodiments of the present disclosure.

In another embodiment, as shown in FIG. 1F, the metrology target 100 may include a fourth set 111 of working zones including a first working zone 114a and a second working zone 114b. The fourth target structure set may include one or more fourth target structures formed within the first working zone 114a and the second working zone 114b.

Figure 1G:
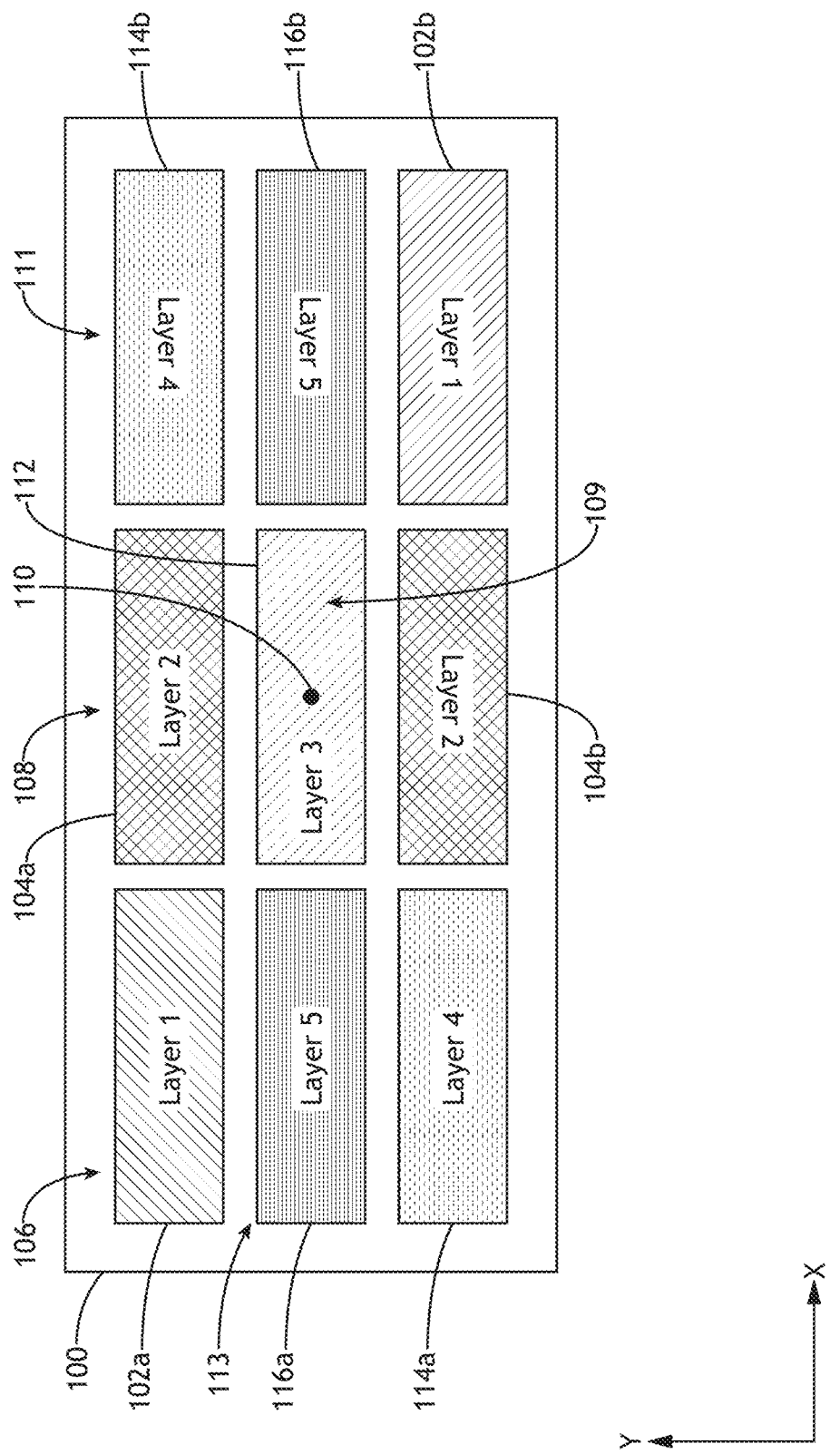
FIG. 1G is a top view of a metrology target, in accordance with one or more embodiments of the present disclosure.

In another embodiment, as shown in FIG. 1G, the metrology target 100 may include a fifth set 113 of working zones including a first working zone 116a and a second working zone 116b The fifth target structure set may include one or more fifth target structures formed within working zones 116a and 116b. It is noted that in this target example one or more working zone sets may include a single working zone 112.

It is noted herein that the embodiments of the present disclosure are not limited to the working zones of the first set of working zones 106 and the second set of working zones 108 having a uniform shape. For example, each of the working zones 102a, 102b, 104a, and 104b may be of any shape, including, without limitation, any polygonal shape. It is further noted that one or more portions of any target structure set (e.g., the first target structure set, the second target structure set, the third target structure set, the fourth target structure set, and/or the fifth target structure set) or any target structure (e.g., the first target structures, the second target structures, the third target structures, the fourth target structures, and/or the fifth target structures may be formed on different or same layers of the metrology target.

Figure 2:
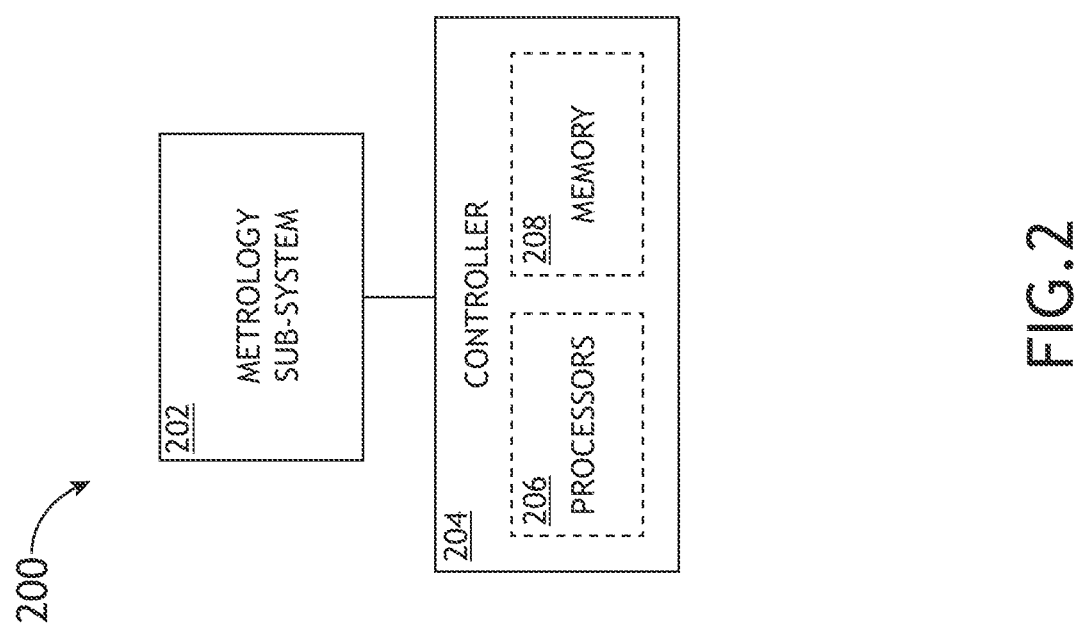
FIG. 2 is a conceptual view of a metrology system, in accordance with one or more embodiments of the present disclosure.

FIG. 2 illustrates a simplified block diagram of a metrology system 200, in accordance with one or more embodiments of the present disclosure. In one embodiment, the metrology system 200 includes one or more metrology sub-systems 202 The one or more metrology sub-systems 202 may be configured to operate in either an imaging more or a non-imaging mode. For example, in an imaging mode, individual overlay target elements may be resolvable within the illuminated spot on the sample (e.g., as part of a bright-field image, a dark-field image, a phase-contrast image, or the like). By way of another example, the one or more metrology sub-systems 202 may operate as a scatterometry-based overlay (SCOL) metrology tool in which radiation from the sample is analyzed at a pupil plane to characterize the angular distribution of radiation from the sample (e.g., associated with scattering and/or diffraction of radiation by the sample).

The one or more metrology sub-systems 202 may direct illumination to a sample and may further collect radiation emanating from the sample to generate an overlay signal suitable for the determination of overlay of two or more sample layers. The one or more metrology sub-systems may include any type of overlay metrology tool known in the art suitable for generating overlay signals suitable for determining overlay associated with overlay targets on a sample, including, without limitation, any optical metrology tool (e.g., an advanced imaging metrology (AIM) tool, an advanced imaging metrology in-die (AIMid) tool, a triple advanced imaging metrology (TAIM) tool, a robust advanced imaging metrology (rAIM) tool, and the like), any particle-based metrology tool (e.g., an electron-beam metrology tool), or a scatterometry-based overlay (SCOL) metrology tool. It is noted that the embodiments of the present disclosure are not limited to a metrology system 200 having only one metrology sub-system 202, and that the metrology system 200 may include at least two metrology sub-systems. For example, the metrology system 200 may include an optical metrology tool and a scatterometry-based overlay (SCOL) metrology tool.

The one or more metrology sub-systems 202 may be configurable to generate overlay signals based on any number of recipes defining measurement parameters for the acquiring an overlay signal suitable for determining overlay of an overlay target. For example, a recipe the one or more metrology sub-systems 202 may include, but are not limited to, an illumination wavelength, a detected wavelength of radiation emanating from the sample, a spot size of illumination on the sample, an angle of incident illumination, a polarization of incident illumination, wave plan of the incident beam, a position of a beam of incident illumination on an overlay target, a position of an overlay target in the focal volume of the overlay metrology tool, or the like.

In another embodiment, the overlay metrology system 200 includes a controller 204 communicatively coupled to the one or more metrology sub-systems 202. The controller 204 may be configured to direct the one or more metrology sub-systems 202 to generate overlay signals based on one or more selected recipes. The controller 204 may be further configured to receive data including, but not limited to, overlay signals from the one or more metrology sub-systems 202. Additionally, the controller 204 may be configured to determine overlay associated with an overlay target based on the acquired overlay signals.

In another embodiment, the controller 204 includes one or more processors 206. For example, the one or more processors 206 may be configured to execute a set of program instructions maintained in a memory medium 208, or memory. The controller 204 may be configured to determine an overlay error of a sample having one or more metrology targets 100 based on one or more overlay measurements of the sample. For example, in one embodiment, the metrology sub-system 202 may direct illumination to a sample having one or more metrology targets 100. In another embodiment, the metrology sub-system 202 may be configured to further collect radiation emanating from the sample to generate one or more overlay measurements (or one or more signals indicative of one or more overlay measurements) suitable for the determination of overlay of two or more sample layers. The metrology sub-system 202 may be configurable to generate overlay signals based on any number of recipes defining measurement parameters for the acquiring an overlay signal suitable for determining overlay of an overlay target. For example, a recipe the metrology sub-system 202 may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, or the like.

The controller 204 may be configured to determine an overlay error of a sample having one or more metrology targets 100 based on one or more overlay measurements of the sample. For example, the controller 204 may be configured to generate one or more overlay measurements of the sample based on one or more signals indicative of illumination emanating from one or more portions of the sample 320 (e.g., the first target structure set, the second target structure set, the third target structure set, the fourth target structure set, and/or the fifth target structure set). The one or more overlay measurements of the sample 320 may correspond to an overlay position of one or more layers of the sample 320.

The one or more processors 206 of the controller 204 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 206 may include any device configured to execute algorithms and/or instructions (e.g., program instructions stored in memory). In one embodiment, the one or more processors 206 may be embodied as a desktop computer, mainframe computer system, workstation, image computer, parallel processor, networked computer, or any other computer system configured to execute a program configured to operate or operate in conjunction with the metrology system 200, as described throughout the present disclosure. Further, the steps described throughout the present disclosure may be carried out by a single controller 204 or, alternatively, multiple controllers. Additionally, the controller 204 may include one or more controllers housed in a common housing or within multiple housings. In this way, any controller or combination of controllers may be separately packaged as a module suitable for integration into metrology system 200. Further, the controller 204 may analyze data received from the one or more metrology sub-systems 202 and feed the data to additional components within the metrology system 200 or external to the metrology system 200.

The memory medium 208 may include any storage medium known in the art suitable for storing program instructions executable by the associated one or more processors 206. For example, the memory medium 208 may include a non-transitory memory medium. By way of another example, the memory medium 208 may include, but is not limited to, a read-only memory (ROM), a random-access memory (RAM), a magnetic or optical memory device (e.g., disk), a magnetic tape, a solid-state drive and the like. It is further noted that memory medium 208 may be housed in a common controller housing with the one or more processors 206. In one embodiment, the memory medium 208 may be located remotely with respect to the physical location of the one or more processors 206 and controller 204. For instance, the one or more processors 206 of controller 204 may access a remote memory (e.g., server), accessible through a network (e.g., internet, intranet and the like).

In one embodiment, a user interface (not shown) is communicatively coupled to the controller 204. The user interface may include, but is not limited to, one or more desktops, laptops, tablets, and the like. In another embodiment, the user interface includes a display used to display data of the metrology system 200 to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface is suitable for implementation in the present disclosure. In another embodiment, a user may input selections and/or instructions responsive to data displayed to the user via a user input device of the user interface.

In another embodiment, the controller 204 is communicatively coupled to one or more elements of the metrology system 200. In this regard, the controller 204 may transmit and/or receive data from any component of the metrology system 200. For example, the controller 204 may be communicatively coupled to the detector 320, 322 to receive one or more images from the detector 320, 322. Further, the controller 204 may direct or otherwise control any component of the metrology system 200 by generating one or more control signals for the associated components.

In one embodiment, as illustrated in FIG. 3A, the one or more metrology sub-systems 202 may include an optical metrology sub-system 202a, such as a metrology sub-system including an optical metrology tool. The optical metrology sub-system 202a may include any type of optical metrology tool known in the art suitable for generating metrology data of a sample, including, without limitation, an optical metrology tool configured to generate and/or detect an optical illumination beam having x-ray, ultraviolet (UV), infrared (IR), or visible light wavelengths. By way of another example, the one or more metrology sub-systems 202a may include an advanced imaging metrology (AIM) tool, an advanced imaging metrology in-die (AIMid) tool, a triple advanced imaging metrology (TAIM) tool, or a robust advanced imaging metrology (rAIM) tool.

In one embodiment, the one or more metrology sub-systems 202a may include an optical illumination source 302 configured to generate an optical illumination beam 304. The optical illumination beam 304 may include one or more selected wavelengths of radiation including, but not limited to, x-ray, ultraviolet (UV) light, visible light, or infrared (IR) light.

The optical illumination source 302 may include any type of illumination source suitable for providing an optical illumination beam 304. In one embodiment, the optical illumination source 302 is a laser source. For example, the optical illumination source 302 may include, but is not limited to, one or more narrowband laser sources, a broadband laser source, a supercontinuum laser source, a white light laser source, or the like. In this regard, the optical illumination source 302 may provide an optical illumination beam 304 having high coherence (e.g., high spatial coherence and/or temporal coherence). In another embodiment, the optical illumination source 302 includes a laser-sustained plasma (LSP) source. For example, the optical illumination source 302 may include, but is not limited to, a LSP lamp, a LSP bulb, or a LSP chamber suitable for containing one or more elements that, when excited by a laser source into a plasma state, may emit broadband illumination. In another embodiment, the optical illumination source 302 includes a lamp source. For example, the optical illumination source 302 may include, but is not limited to, an arc lamp, a discharge lamp, an electrode-less lamp, or the like. In this regard, the optical illumination source 302 may provide an optical illumination beam 304 having low coherence (e.g., low spatial coherence and/or temporal coherence).

In another embodiment, the optical illumination source 302 directs the optical illumination beam 304 to the sample 320 via an illumination pathway 310. The illumination pathway 310 may include one or more illumination pathway lenses 308 or additional optical components 306 suitable for modifying and/or conditioning the optical illumination beam 304. For example, the one or more optical components 306 may include, but are not limited to, one or more polarizers, one or more filters, one or more beam splitters, one or more diffusers, one or more homogenizers, one or more apodizers, or one or more beam shapers. The illumination pathway 310 may further include an objective lens 316 configured to direct the optical illumination beam 304 to the sample 320.

In another embodiment, the sample 320 is disposed on a sample stage 322. The sample stage 322 may include any device suitable for positioning and/or scanning the sample 320 within the one or more metrology sub-systems 202a. For example, the sample stage 322 may include any combination of linear translation stages, rotational stages, tip/tilt stages, or the like.

In another embodiment, the one or more metrology sub-systems 202a include one or more detectors 324 configured to capture light emanating from the sample 320 through a collection pathway 314. The collection pathway 314 may include, but is not limited to, one or more collection pathway lenses 312, 318 for collecting light from the sample 320. For example, the one or more detectors 324 may receive light reflected or scattered (e.g., via specular reflection, diffuse reflection, and the like) from the sample 320 via one or more collection pathway lenses 312, 318. By way of another example, the one or more detectors 324 may receive light generated by the sample 320 (e.g., luminescence associated with absorption of the optical illumination beam 304, or the like). By way of another example, the one or more detectors 324 may receive one or more diffracted orders of light from the sample 320 (e.g., 0-order diffraction, ±1 order diffraction, ±2 order diffraction, and the like).

The one or more detectors 324 may include any type of detector known in the art suitable for measuring illumination received from the sample 320. For example, a detector 324 may include, but is not limited to, a CCD detector, a TDI detector, a photomultiplier tube (PMT), an avalanche photodiode (APD), a complementary metal-oxide-semiconductor (CMOS) sensor, or the like. In another embodiment, a detector 324 may include a spectroscopic detector suitable for identifying wavelengths of light emanating from the sample 320.

In one embodiment, the one or more detectors 324 are positioned approximately normal to the surface of the sample 320. In another embodiment, the one or more metrology sub-systems 202a includes a beamsplitter oriented such that the objective lens 316 may simultaneously direct the optical illumination beam 304 to the sample 320 and collect light emanating from the sample 320. Further, the illumination pathway 310 and the collection pathway 314 may share one or more additional elements (e.g., objective lens 316, apertures, filters, or the like).

Figure 3B:
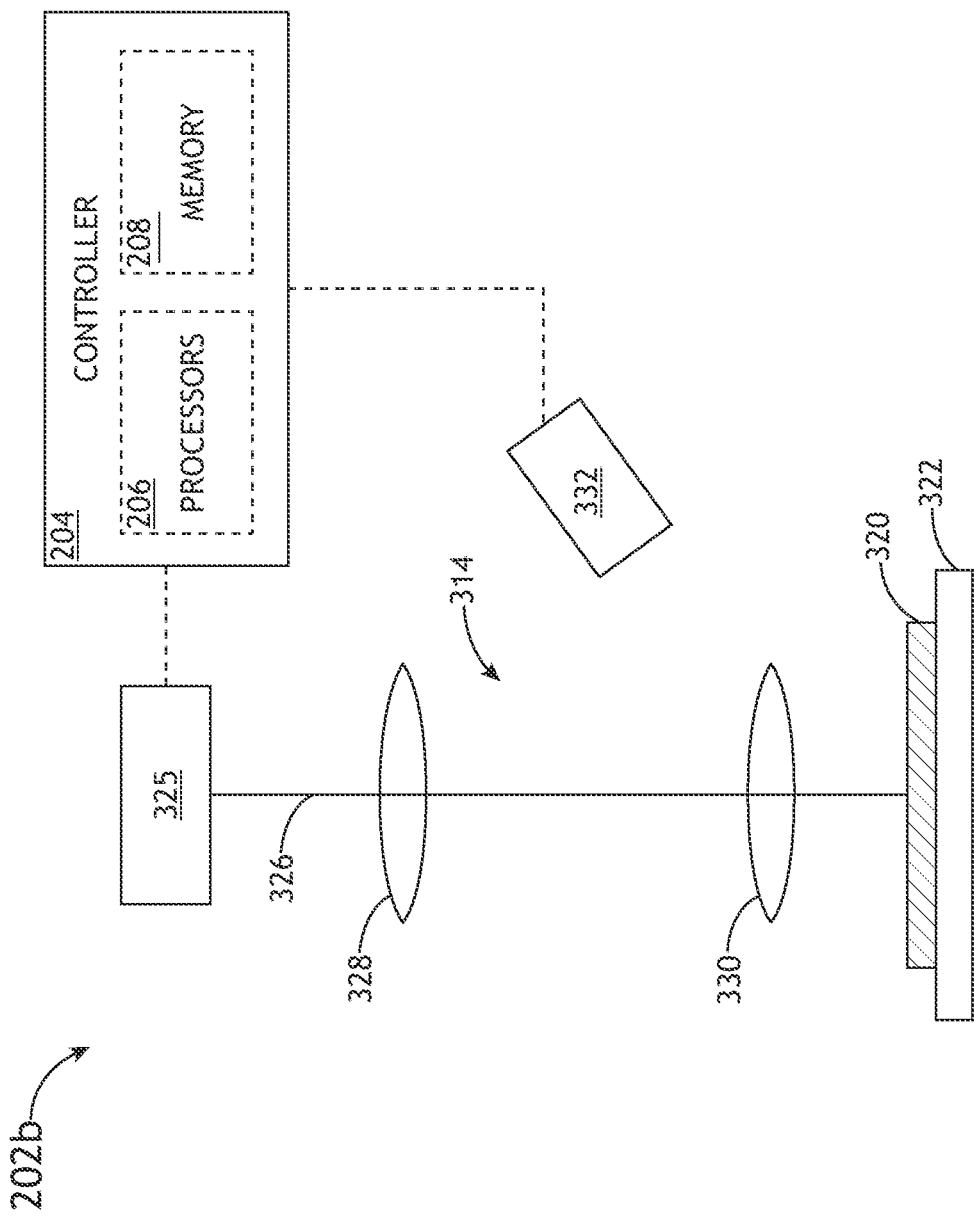
FIG. 3B illustrates a conceptual view of a metrology sub-system, in accordance with one or more embodiments of the present disclosure.

In one embodiment, as shown in FIG. 3B, the one or more metrology sub-systems 202 may include a particle-based metrology sub-system 202b, such as a metrology sub-system including an electron-beam metrology tool (e.g., a SEM, a CD-SEM, or the like).

In one embodiment, the one or more metrology sub-systems 202b may include a particle source 325 (e.g., an electron beam source, an ion beam source, or the like) to generate a particle beam 326 (e.g., an electron beam, a particle beam, or the like). The particle source 325 may include any particle source known in the art suitable for generating a particle beam 326. For example, the particle source 325 may include, but is not limited to, an electron gun or an ion gun. In another embodiment, the particle source 325 is configured to provide a particle beam with a tunable energy. For example, particle source 325 may include, but is not limited to, an electron source configured provide an accelerating voltage in the range of 0.1 kV to 30 kV. As another example, a particle source 325 including an ion source may, but is not required to, provide an ion beam with an energy in the range of 1 to 50 keV.

In another embodiment, the one or more metrology sub-systems 202b may include one or more particle focusing elements 328. For example, the one or more particle focusing elements 328 may include, but are not limited to, a single particle focusing element or one or more particle focusing elements forming a compound system. In another embodiment, the one or more particle focusing elements 328 include a particle objective lens 330 configured to direct the particle beam 326 to the sample 320 located on the sample stage 322. Further, the particle source 325 may include any type of electron lenses known in the art including, but not limited to, electrostatic, magnetic, uni-potential, or double-potential lenses.

In another embodiment, the one or more metrology sub-systems 202b may include at least one particle detector 332 to image or otherwise detect particles emanating from the sample 320. In one embodiment, the particle detector 332 includes an electron collector (e.g., a secondary electron collector, a backscattered electron detector, or the like). In another embodiment, the particle detector 332 includes a photon detector (e.g., a photodetector, an x-ray detector, a scintillating element coupled to photomultiplier tube (PMT) detector, or the like) for detecting electrons and/or photons from the sample surface. It is specifically contemplated that the one or more metrology sub-systems 202b may include a plurality (e.g., at least two) particle detectors 332. It is noted herein that certain types of particle detectors 332 (e.g., photomultiplier detectors) may increase sensitivity of the one or more metrology sub-systems 202b.

It is to be understood that the description of the one or more metrology sub-systems 202, as depicted in FIGS. 3A 3B, and the associated descriptions above, are provided solely for illustrative purposes and should not be interpreted as limiting. For example, the one or more metrology sub-systems 202 may include a multi-beam and/or a multi-column system suitable for simultaneously interrogating a sample 320. In a further embodiment, one or more metrology sub-systems 202 may include one or more components (e.g., one or more electrodes) configured to apply one or more voltages to one or more locations of the sample 320. In this regard, the one or more metrology sub-systems 202 may generate voltage contrast imaging data.

It is recognized herein that the penetration depth of the particle beam 326 in the sample 320 may depend on the particle energy such that higher-energy beams typically penetrate deeper into the sample. In one embodiment, the one or more metrology sub-systems 202b may utilize different particle energies to interrogate different layers of the device based on the penetration depth of the particle beam 326 into the sample 320. For example, the one or more metrology sub-systems 202b may utilize a relatively low-energy electron beam (e.g., approximately 1 keV or less) and may utilize a higher energy beam (e.g., approximately 10 keV or higher) to characterize a previously fabricated layer. It is recognized herein that the penetration depth as a function of particle energy may vary for different materials such that the selection of the particle energy for a particular layer may vary for different materials.

As previously described, the one or more metrology sub-systems 202 may include a controller 204 communicatively coupled to the one or more metrology sub-systems 202. The controller 204 may be configured to direct the one or more metrology sub-systems 204 to generate overlay signals based on one or more selected recipes. The controller 204 may be further configured to receive data including, but not limited to, overlay signals from the one or more metrology sub-systems 202. Additionally, the controller 204 may be configured to determine overlay associated with an overlay target based on the acquired overlay signals.

Figure 4:
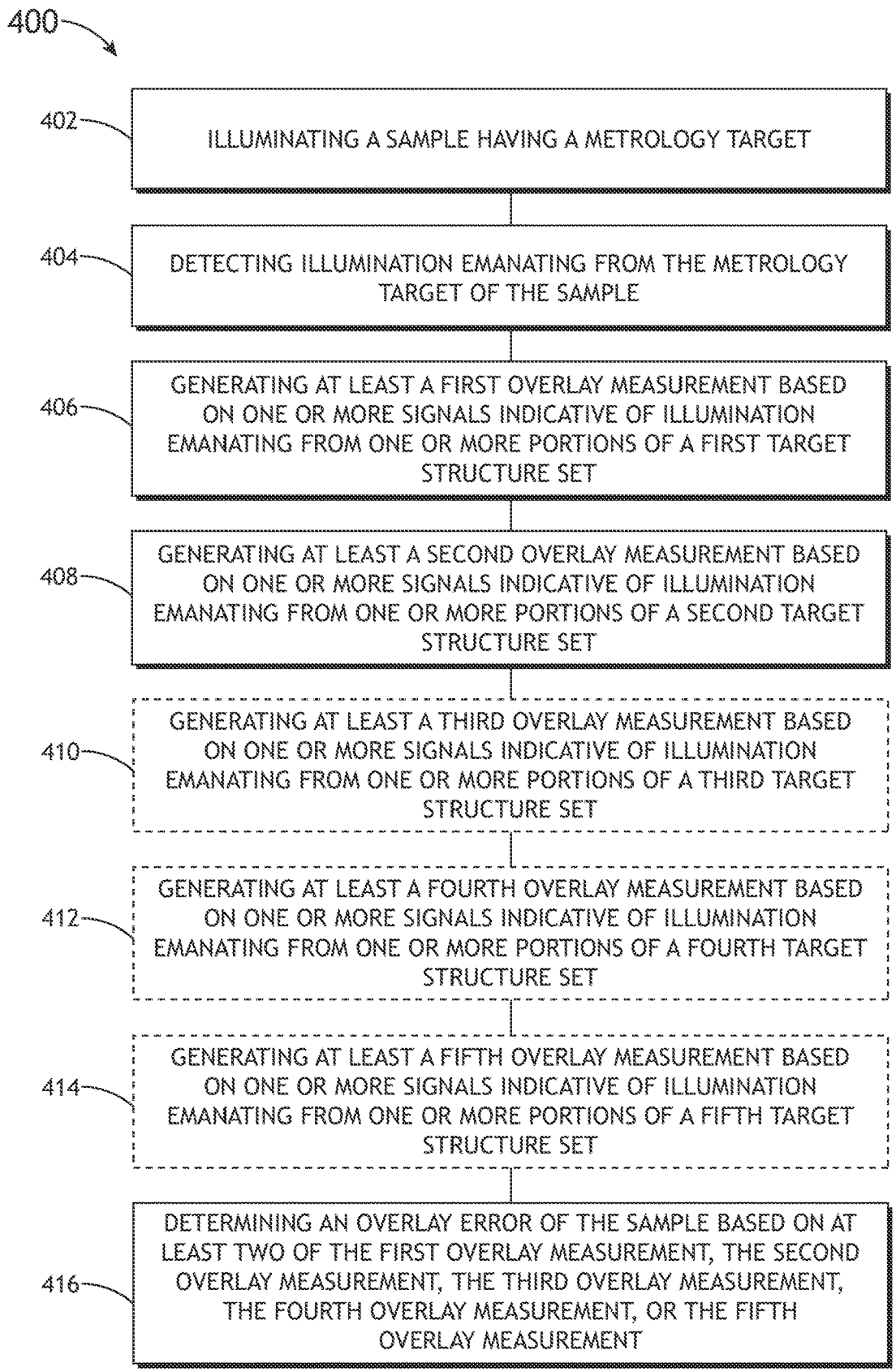
FIG. 4 is a process flow diagram depicting the steps of a method of measuring overlay of a sample, in accordance with one or more embodiments of the present disclosure.

FIG. 4 illustrates a process flow diagram depicting the steps of a method 400 of measuring overlay of a sample, in accordance with one or more embodiments of the present disclosure.

In Step 402, a sample including one or more metrology targets 100 is illuminated. For example, the metrology system 200 may direct an illumination beam onto the sample 320. As used herein, the term "illumination beam" may refer to any radiant beam, including, without limitation, the optical illumination beam 304 and/or the particle beam 326.

In Step 404, illumination emanating from the one or more metrology targets 100 is detected. For example, the optical illumination beam 304 and/or the particle beam 326 may be detected. By way of another example, the one or more metrology sub-systems 202 may be configured to receive illumination emanating from one or more portions of the one or more metrology targets 100 (e.g., the first target structure set, the second target structure set, the third target structure set, the fourth target structure set, and/or the fifth target structure set).

In Step 406, one or more first overlay measurements are generated. For example, the controller 204 may be configured to generate one or more first overlay measurements of the sample 320 based on one or more signals indicative of illumination emanating from one or more portions of the first target structure set of the one or more metrology targets 100.

In Step 408, one or more second overlay measurements are generated. For example, the controller 204 may be configured to generate one or more second overlay measurements of the sample 320 based on one or more signals indicative of illumination emanating from one or more portions of second target structure set of the one or more metrology targets 100.

In some embodiments, the method 400 includes a Step 410, wherein one or more third overlay measurements are generated. For example, the controller 204 may be configured to generate one or more third overlay measurements of the sample 320 based on one or more signals indicative of illumination emanating from one or more portions of the third target structure set of the one or more metrology targets 100.

In some embodiments, the method 400 includes a Step 412, wherein one or more fourth overlay measurements are generated. For example, the controller 204 may be configured to generate one or more fourth overlay measurements of the sample 320 based on one or more signals indicative of illumination emanating from one or more portions of the fourth target structure set of the one or more metrology targets 100.

In some embodiments, the method 400 includes a Step 414, wherein one or more fifth overlay measurements are generated. For example, the controller 204 may be configured to generate one or more fifth overlay measurements of the sample 320 based on one or more signals indicative of illumination emanating from one or more portions of the fifth target structure set of the one or more metrology targets 100.

In Step 416, an overlay error is determined based on at least two of the one or more first overlay measurements, the one or more second overlay measurements, the one or more third overlay measurements, the one or more fourth overlay measurements, or the fifth overlay measurements.

In some embodiments, the method 400 may include one or more additional steps (not shown) wherein one or more overlay correctables are provided based on the one or more overlay values determined in at least Step 416. For example, the one or more additional steps may include the controller 204 generating one or more control signals (or corrections to the control signals) for adjusting one or more parameters (e.g., fabrication settings, configuration, and the like) of one or more process tools (e.g., lithographic tools). The control signals (or corrections to the control signals) may be provided by the controller 204 as part of a feedback and/or feedforward control loop. The controller 204 may cause the one or more process tools to execute one or more adjustments to the one or more parameters of the one or more process tools based on the one or more control signals (or corrections to the control signals). In some embodiments, the controller 204 may alert a user to make the one or more adjustments. In this sense, the one or more control signals may compensate for errors of one or more fabrication processes of the one or more process tools, and thus may enable the one or more process tools to maintain overlay within selected tolerances across multiple exposures on subsequent samples in the same or different lots.

Figure 5:
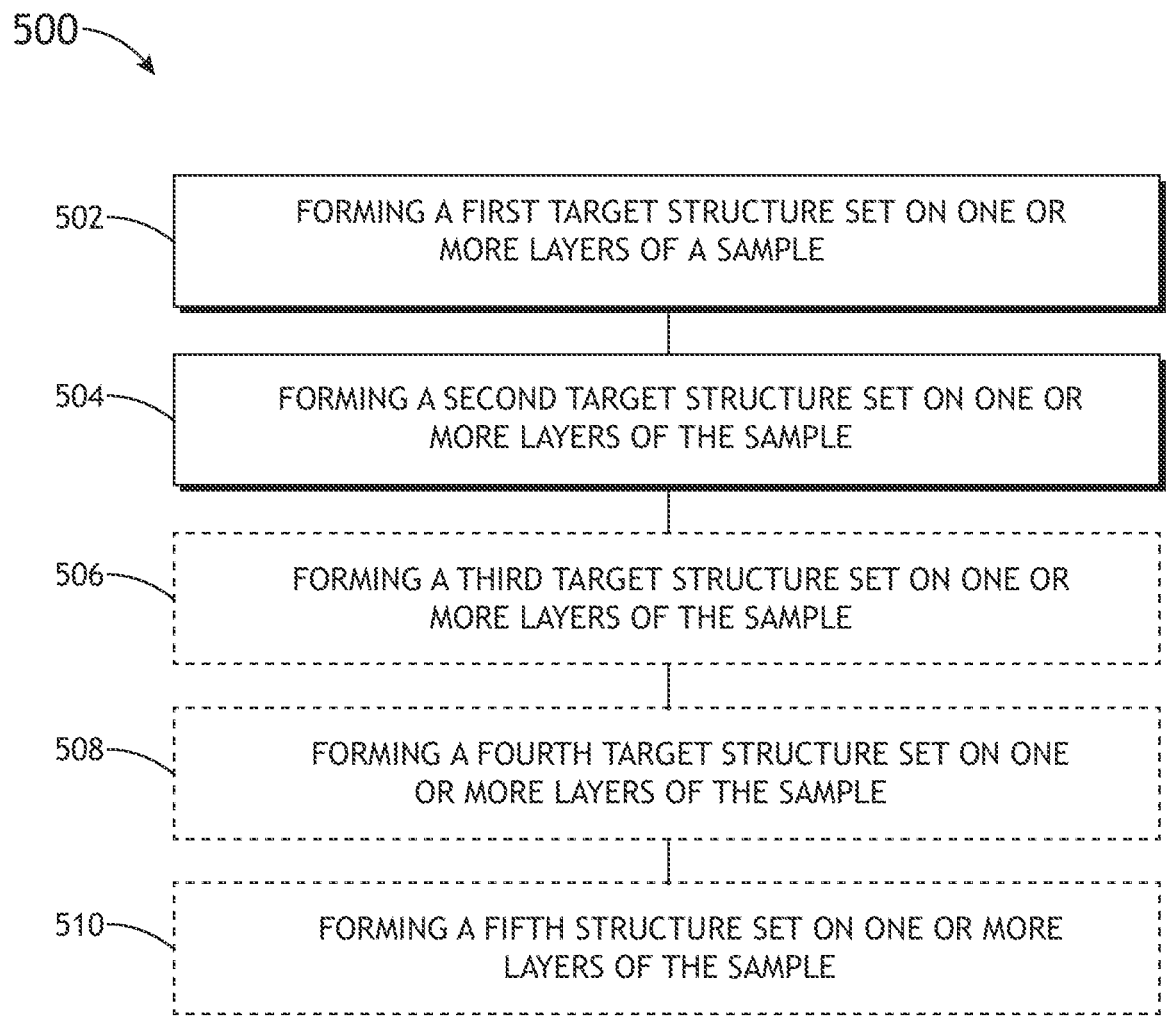
FIG. 5 is a process flow diagram depicting the steps of a method of forming a metrology target, in accordance with one or more embodiments of the present disclosure.

FIG. 5 illustrates a process flow diagram illustrating the steps of a method 500 of forming a metrology target 100, in accordance with one or more embodiments of the present disclosure.

In Step 502, a first target structure set is formed on one or more layers of the metrology target 100, wherein the first target structure set comprises at least one first target structure formed within at least one of a first working zone of the metrology target or a second working zone of the metrology target, wherein each first target structure comprises one or more first pattern elements formed along at least one of a first measurement direction or a second measurement direction. The first target structure set may be fabricated through one or more process steps such as, but not limited to, one or more deposition, lithographic, or etching steps. The first target structure set may be formed using one or more process tools (e.g., lithographic tools).

In Step 504, a second target structure set is formed on one or more layers of the metrology target 100, wherein the second target structure set comprises at least one second target structure formed within at least one of the first working zone of the metrology target or the second working zone of the metrology target, wherein each second target structure comprises one or more second pattern elements formed along at least one of the first measurement direction or the second measurement direction, and wherein the first working zone of the metrology target and the second working zone of the metrology target are two-fold rotationally symmetric. The second target structure set may be fabricated through one or more process steps such as, but not limited to, one or more deposition, lithographic, or etching steps. The second target structure set may be formed using one or more process tools (e.g., lithographic tools).

In some embodiments, the method 500 includes a Step 506, wherein a third target structure set is formed on one or more layers of the metrology target 100, wherein the third target structure set comprises at least one third target structure formed within at least one of the first working zone of the metrology target or the second working zone of the metrology target, wherein the third target structure comprises one or more third pattern elements formed along at least one of the first measurement direction or the second measurement direction. The third target structure set may be fabricated through one or more process steps such as, but not limited to, one or more deposition, lithographic, or etching steps. The third target structure set may be formed using one or more process tools (e.g., lithographic tools).

In some embodiments, the method 500 includes a Step 508, wherein a fourth target structure set is formed on one or more layers of the metrology target 100, wherein the fourth target structure set comprises at least one fourth target structure formed within at least one of the first working zone of the metrology target or the second working zone of the metrology target, wherein the fourth target structure comprises one or more fourth pattern elements formed along at least one of the first measurement direction or the second measurement direction. The fourth target structure set may be fabricated through one or more process steps such as, but not limited to, one or more deposition, lithographic, or etching steps. The fourth target structure set may be formed using one or more process tools (e.g., lithographic tools).

In some embodiments, the method 500 includes a Step 510, wherein a fifth target structure set is formed on one or more layers of the metrology target 100, wherein the fifth target structure set comprises at least one fifth target structure formed within at least one of the first working zone of the metrology target or the second working zone of the metrology target, wherein the fifth target structure comprises one or more fifth pattern elements formed along at least one of the first measurement direction or the second measurement direction. The fifth target structure set may be fabricated through one or more process steps such as, but not limited to, one or more deposition, lithographic, or etching steps. The fifth target structure set may be formed using one or more process tools (e.g., lithographic tools).

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology target, comprising:
   a first target structure set formed on a sample, wherein the first target structure set comprises a first set of working zones comprising a first working zone and at least a second working zone, wherein a first target structure is formed within the first working zone and at least a second target structure is formed within the at least the second working zone, wherein the first target structure set includes periodic structures along one measurement direction, wherein an orientation of one or more patterns in the first working zone of the first set of working zones is different from the orientation of one or more patterns in the at the second working zone of the first set of working zones; and
   a second target structure set formed on the sample, wherein the second target structure set comprises at least a second set of working zones comprising a first working zone and at least a second working zone, wherein a first target structure is formed within the first working zone and at least a second target structure is formed within the at least the second working zone, wherein the second target structure set includes periodic structures along the one measurement direction, wherein an orientation of one or more patterns in the first working zone of the first set of working zones is different from the orientation of one or more patterns in the at the second working zone of the at least the second set of working zones,
   wherein the first set of working zones is at least two-fold rotationally symmetric about a center of rotation symmetry of the first set of working zones and the at least the second set of working zones is at least two-fold rotationally symmetric about a center of rotation symmetry of the at least the second set of working zones,
   wherein a difference between the center of rotation symmetry of the first set of working zones and the center of rotation symmetry of the at least the second set of working zones is indicative of overlay error along the one measurement direction.

2. A system comprising:
   a controller communicatively couplable to one or more metrology sub-systems, wherein the controller includes one or more processors, wherein the one or more processors are configured to execute a set of program instructions maintained in memory, wherein the set of program instructions is configured to cause the one or more processors to:

receive, from the one or more metrology sub-systems, one or more signals indicative of illumination emanating from a metrology target of a sample, wherein the metrology target of the sample comprises: a first target structure set formed on a sample, wherein the first target structure set comprises a first set of working zones comprising a first working zone and at least a second working zone, wherein a first target structure is formed within the first working zone and at least a second target structure is formed within the at least the second working zone, wherein the first target structure set includes periodic structures along one measurement direction, wherein an orientation of one or more patterns in the first working zone of the first set of working zones is different from the orientation of one or more patterns in the at the second working zone of the first set of working zones; and a second target structure set formed on the sample, wherein the second target structure set comprises at least a second set of working zones comprising a first working zone and at least a second working zone, wherein a first target structure is formed within the first working zone and at least a second target structure is formed within the second working zone, wherein the second target structure set includes periodic structures along the one measurement direction, wherein an orientation of one or more patterns in the first working zone of the first set of working zones is different from the orientation of one or more patterns in the at the second working zone of the at least the second set of working zones, wherein the first set of working zones is at least two-fold rotationally symmetric about a center of rotation symmetry of the first set of working zones and the at least the second set of working zones is at least two-fold rotationally symmetric about a center of rotation symmetry of the at least the second set of working zones, wherein a difference between the center of rotation symmetry of the first set of working zones and the center of rotation symmetry of the at least the second set of working zones;

generate at least a first overlay measurement based on one or more signals indicative of illumination emanating from one or more portions of the first target structure set;

generate at least a second overlay measurement based on one or more signals indicative of illumination emanating from one or more portions of the second target structure set; and determine an overlay error along the one measurement direction of the sample based on the first overlay measurement and the second overlay measurement.

3. The system of claim 2, wherein the first metrology measurement comprises an overlay metrology measurement along at least one of the first measurement direction or the second measurement direction.

4. The system of claim 2, wherein the second metrology measurement comprises an overlay metrology measurement along at least one of the first measurement direction or the second measurement direction.

5. The system of claim 2, wherein the sample comprises a semiconductor wafer.

6. A method of measuring overlay of a sample, comprising:

illuminating a sample having a metrology target, the metrology target comprising: a first target structure set formed on a sample, wherein the first target structure set comprises a first set of working zones comprising a first working zone and at least a second working zone, wherein a first target structure is formed within the first working zone and at least a second target structure is formed within the at least the second working zone, wherein the first target structure set includes periodic structures along one measurement direction, wherein an orientation of one or more patterns in the first working zone of the first set of working zones is different from the orientation of one or more patterns in the at the second working zone of the first set of working zones; and a second target structure set formed on the sample, wherein the second target structure set comprises at least a second set of working zones comprising a first working zone and at least a second working zone, wherein a first target structure is formed within the first working zone and at least a second target structure is formed within the second working zone, wherein the second target structure set includes periodic structures along the one measurement direction, wherein an orientation of one or more patterns in the first working zone of the first set of working zones is different from the orientation of one or more patterns in the at the second working zone of the at least the second set of working zones, wherein the first set of working zones is at least two-fold rotationally symmetric about a center of rotation symmetry of the first set of working zones and the at least the second set of working zones is at least two-fold rotationally symmetric about a center of rotation symmetry of the at least the second set of working zones, wherein a difference between the center of rotation symmetry of the first set of working zones and the center of rotation symmetry of the at least the second set of working zones;

detecting illumination emanating from the metrology target of the sample;

generating at least a first overlay measurement based on one or more signals indicative of illumination emanating from one or more portions of the first target structure set;

generating at least a second overlay measurement based on one or more signals indicative of illumination emanating from one or more portions of the second target structure set; and determining an overlay error along the one measurement direction of the sample based on the first overlay measurement and the second overlay measurement.

7. The method of claim 6, wherein the first metrology measurement comprises an overlay metrology measurement along at least one of the first measurement direction or the second measurement direction.

8. The method of claim 6, wherein the second metrology measurement comprises an overlay metrology measurement along at least one of the first measurement direction or the second measurement direction.

9. The method of claim 6, wherein the sample comprises a semiconductor wafer.

10. A method of forming a metrology target comprising:

forming a first target structure set on a sample, wherein the first target structure set comprises a first set of working zones comprising a first working zone and at least a second working zone, wherein a first target structure is formed within the first working zone and at least a second target structure is formed within the at least the second working zone, wherein the first target structure set includes periodic structures along one measurement direction, wherein an orientation of one or more patterns in the first working zone of the first set of working zones is different from the orientation of one or more patterns in the at the second working zone of the first set of working zones; and forming a second target structure set on the sample, wherein the second target structure set comprises at least a second set of working zones comprising a first working zone and at least a second working zone, wherein a first target structure is formed within the first working zone and at least a second target structure is formed within the second working zone, wherein the second target structure set includes periodic structures along the one measurement direction, wherein an orientation of one or more patterns of the first working zone of the first set of working zones is different from the orientation of one or more patterns in the at the second working zone of the first set of working zones, wherein the first set of working zones is at least two-fold rotationally symmetric about a center of rotation symmetry of the first set of working zones and the at least the second set of working zones is at least two-fold rotationally symmetric about a center of rotation symmetry of the at least the second set of working zones, wherein a difference between the center of rotation symmetry of the first set of working zones and the center of rotation symmetry of the at least the second set of working zones.

11. The metrology target of claim 1, wherein the at least the second working zone of the first set of working zones is formed diagonal to the first working zone of the first set of working zones and wherein the at least the second working zone of the at least the second set of working zones is formed diagonal to the first working zone of the at least the second set of working zones.

12. The metrology target of claim 1, wherein the second working zone of the first set of working zones is formed vertically adjacent to the first working zone of the first set of working zones and wherein the first working zone and the second working zone of the first working zone set are formed between the first working zone and the at least the second working zone of the at least the second working zone set.

13. The metrology target of claim 1, wherein the first working zone set and the second working zone set are formed in different physical layers of the sample.

14. The metrology target of claim 1, wherein the first working zone set and the second working zone set are formed in the same physical layer and have different features.

15. The metrology target of claim 1, wherein the first working zone and the at least the second working zone of the first working zone set contains a set of pattern elements have periodicity in one dimension and wherein the first working zone and the at least the second working zone of the at least the second working zone set contains a set of pattern elements have periodicity in one dimension.

16. The metrology target of claim 1, wherein the first working zone and the at least the second working zone of the first working zone set contains a set of pattern elements have periodicity in two dimensions and wherein the first working zone and the at least the second working zone of the at least the second working zone set contains a set of pattern elements have periodicity in two dimensions.

17. The metrology target of claim 1, wherein an exterior form-factor of the first working zone and the at least the second working zone of the first working zone set and the first working zone and the at least the second working zone of the second working zone set comprise at least one of a square, a rectangle, a circle, a star, or a rhombus.

18. The metrology target of claim 1, wherein sizes of the first working zone and the at least the second working zone of the first working zone set are different from the sizes of the first working zone and the at least the second working zone of the second working zone set.

19. The metrology target of claim 1, further comprising at least three working zone sets.

20. The system of claim 2, wherein the at least the second working zone of the first set of working zones is formed diagonal to the first working zone of the first set of working zones and wherein the at least the second working zone of the at least the second set of working zones is formed diagonal to the first working zone of the at least the second set of working zones.

21. The system of claim 2, wherein the second working zone of the first set of working zones is formed vertically adjacent to the first working zone of the first set of working zones and wherein the first working zone and the second working zone of the first working zone set are formed between the first working zone and the at least the second working zone of the at least the second working zone set.

22. The system of claim 2, wherein the first working zone set and the second working zone set are formed in different physical layers of the sample.

23. The system of claim 2, wherein the first working zone set and the second working zone set are formed in the same physical layer and have different features.

24. The system of claim 2, wherein the first working zone and the at least the second working zone of the first working zone set contains a set of pattern elements having periodicity in one dimension and wherein the first working zone and the at least the second working zone of the at least the second working zone set contains a set of pattern elements having periodicity in one dimension.

25. The system of claim 2, wherein the first working zone and the at least the second working zone of the first working zone set contains a set of pattern elements having periodicity in two dimensions and wherein the first working zone and the at least the second working zone of the at least the second working zone set contains a set of pattern elements having periodicity in two dimensions.

26. The system of claim 2, wherein an exterior form-factor of the first working zone and the at least the second working zone of the first working zone set and the first working zone and the at least the second working zone of the second working zone set comprise at least one of a square, a rectangle, a circle, a star, or a rhombus.

27. The system of claim 2, wherein sizes of the first working zone and the at least the second working zone of the first working zone set are different from the sizes of the first working zone and the at least the second working zone of the second working zone set.

28. The system of claim 2, further comprising at least three working zone sets.

29. The method of claim 6, wherein the at least the second working zone of the first set of working zones is formed diagonal to the first working zone of the first set of working zones and wherein the at least the second working zone of the at least the second set of working zones is formed diagonal to the first working zone of the at least the second set of working zones.

30. The method of claim 6, wherein the second working zone of the first set of working zones is formed vertically adjacent to the first working zone of the first set of working zones and wherein the first working zone and the second working zone of the first working zone set are formed between the first working zone and the at least the second working zone of the at least the second working zone set.

31. The method of claim 6, wherein the first working zone set and the second working zone set are formed in different physical layers of the sample.

32. The method of claim 6, wherein the first working zone set and the second working zone set are formed in the same physical layer and have different features.

33. The method of claim 6, wherein the first working zone and the at least the second working zone of the first working zone set contains a set of pattern elements having periodicity in one dimension and wherein the first working zone and the at least the second working zone of the at least the second working zone set contains a set of pattern elements having periodicity in one dimension.

34. The method of claim 6, wherein the first working zone and the at least the second working zone of the first working zone set contains a set of pattern elements having periodicity in two dimensions and wherein the first working zone and the at least the second working zone of the at least the second working zone set contains a set of pattern elements having periodicity in two dimensions.

35. The method of claim 6, wherein an exterior form-factor of the first working zone and the at least the second working zone of the first working zone set and the first working zone and the at least the second working zone of the second working zone set comprise at least one of a square, a rectangle, a circle, a star, or a rhombus.

36. The method of claim 6, wherein sizes of the first working zone and the at least the second working zone of the first working zone set are different from the sizes of the first working zone and the at least the second working zone of the second working zone set.

37. The method of claim 6, further comprising at least three working zone sets.

38. The method of claim 10, wherein the at least the second working zone of the first set of working zones is formed diagonal to the first working zone of the first set of working zones and wherein the at least the second working zone of the at least the second set of working zones is formed diagonal to the first working zone of the at least the second set of working zones.

39. The method of claim 10, wherein the second working zone of the first set of working zones is formed vertically adjacent to the first working zone of the first set of working zones and wherein the first working zone and the second working zone of the first working zone set are formed between the first working zone and the at least the second working zone of the at least the second working zone set.

40. The method of claim 10, wherein the first working zone set and the second working zone set are formed in different physical layers of the sample.

41. The method of claim 10, wherein the first working zone set and the second working zone set are formed in the same physical layer and have different features.

42. The method of claim 10, wherein the first working zone and the at least the second working zone of the first working zone set contains a set of pattern elements having periodicity in one dimension and wherein the first working zone and the at least the second working zone of the at least the second working zone set contains a set of pattern elements having periodicity in one dimension.

43. The method of claim 10, wherein the first working zone and the at least the second working zone of the first working zone set contains a set of pattern elements having periodicity in two dimensions and wherein the first working zone and the at least the second working zone of the at least the second working zone set contains a set of pattern elements having periodicity in two dimensions.

44. The method of claim 10, wherein an exterior form-factor of the first working zone and the at least the second working zone of the first working zone set and the first working zone and the at least the second working zone of the second working zone set comprise at least one of a square, a rectangle, a circle, a star, or a rhombus.

45. The method of claim 10, wherein sizes of the first working zone and the at least the second working zone of the first working zone set are different from the sizes of the first working zone and the at least the second working zone of the second working zone set.

46. The method of claim 10, further comprising at least three working zone sets.

* * * * *